US012170296B2

(12) United States Patent
Lee et al.

(10) Patent No.: US 12,170,296 B2
(45) Date of Patent: Dec. 17, 2024

(54) IMAGE SENSOR WITH PIXEL SEPARATION STRUCTURE

(71) Applicant: SAMSUNG ELECTRONICS CO., LTD., Suwon-si (KR)

(72) Inventors: Seungjoon Lee, Busan (KR); Jung Bin Yun, Hwaseong-si (KR); Kyungho Lee, Suwon-si (KR); Jihun Kim, Suwon-si (KR); Junghyung Pyo, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 546 days.

(21) Appl. No.: 17/491,705

(22) Filed: Oct. 1, 2021

(65) Prior Publication Data

US 2022/0216250 A1 Jul. 7, 2022

(30) Foreign Application Priority Data

Jan. 4, 2021 (KR) .......................... 10-2021-0000249

(51) Int. Cl.
*H01L 27/146* (2006.01)
(52) U.S. Cl.
CPC .. *H01L 27/14605* (2013.01); *H01L 27/14612* (2013.01); *H01L 27/14621* (2013.01); *H01L 27/14627* (2013.01)
(58) Field of Classification Search
CPC ......... H01L 27/14605; H01L 27/14612; H01L 27/14621; H01L 27/14627; H01L 27/1461; H01L 27/1463; H01L 27/14641; H01L 27/1464; H01L 27/14603; H01L 27/14609; H01L 27/14645
See application file for complete search history.

(56) References Cited

U.S. PATENT DOCUMENTS

| 9,609,250 | B2 * | 3/2017 | Lee ................. H01L 27/14612 |
| 10,304,887 | B2 | 5/2019 | Kim et al. |
| 10,566,380 | B2 | 2/2020 | Jung et al. |
| 10,700,114 | B2 | 6/2020 | Honda et al. |
| 2020/0235148 | A1 | 7/2020 | Shim |

(Continued)

FOREIGN PATENT DOCUMENTS

JP 2018-201015 12/2018

*Primary Examiner* — Tony Ko
(74) *Attorney, Agent, or Firm* — F. CHAU & ASSOCIATES, LLC

(57) ABSTRACT

Disclosed is an image sensor comprising a semiconductor substrate that includes first through fourth pixel regions, each including first through fourth photoelectric conversion sections, and a pixel separation structure disposed in the semiconductor substrate and separating the first through fourth pixel regions from each other. The second pixel region is spaced apart in a first direction from the first pixel region. The fourth pixel region is spaced apart in a second direction from the first pixel region. The second direction intersects the first direction. The semiconductor substrate includes first impurity sections disposed on corresponding central portions of the first through fourth pixel regions, and a second impurity section disposed between the second and fourth pixel regions. Impurities doped in the first impurity sections have a conductivity type different from that of impurities doped in the second impurity section.

20 Claims, 16 Drawing Sheets

(56) References Cited

U.S. PATENT DOCUMENTS

| | | |
|---|---|---|
| 2020/0235149 A1 | 7/2020 | Shiraishi et al. |
| 2020/0243578 A1 | 7/2020 | Pyo et al. |
| 2021/0074745 A1* | 3/2021 | Mi .................. H04N 25/74 |

\* cited by examiner

IMAGE SENSOR WITH PIXEL SEPARATION STRUCTURE

CROSS-REFERENCE TO RELATED APPLICATION

This U.S. nonprovisional application claims priority under 35 U.S.C § 119 to Korean Patent Application No. 10-2021-0000249 filed on Jan. 4, 2021 in the Korean Intellectual Property Office, the disclosure of which is hereby incorporated by reference in its entirety.

TECHNICAL FIELD

The present inventive concepts relate to an image sensor, and more particularly, to an image sensor with a pixel separation structure.

DISCUSSION OF THE RELATED ART

Image sensors are semiconductor components that can convert optical information into electrical signals. They are often included with electronic devices, such as digital cameras, camcorders, PCSs (personal communication systems), game devices, security cameras, and medical micro-cameras.

Image sensors are generally classified into two types based on the technologies used to implement them: charged coupled device (CCD) image sensors and CMOS image sensors. CCD image sensors use a "global shutter", wherein light is converted into charge for all pixels at the same time, whereas CMOS image sensors generally capture light one pixel at a time using a "rolling shutter." Recently, there has been increased demand for CMOS image sensors, as they have a relatively simple operating method, and they may have smaller size than CCD sensors because their signal processing circuit is integrated into a single chip. Also, CMOS image sensors require relatively small power consumption, which is useful in battery-powered applications. Accordingly, the use of the CMOS image sensor has been rapidly increasing as a result of advanced in technology and implementation of high resolution.

SUMMARY

Some embodiments of the present inventive concepts provide an image sensor with increased optical and electrical performance.

According to some embodiments of the present inventive concepts, an image sensor may include: a semiconductor substrate with first, second, third, and fourth pixel regions, wherein each of the first through fourth pixel regions include first, second, third, and fourth photoelectric conversion sections; a pixel separation structure disposed in the semiconductor substrate, wherein the pixel separation structure separates the first through fourth pixel regions from each other, wherein the second pixel region is spaced apart from the first pixel region in a first direction, wherein the fourth pixel region is spaced apart from the first pixel region in a second direction, and wherein the second direction intersects the first direction. The semiconductor substrate includes: a plurality of first impurity sections, wherein each first impurity section of the plurality of first impurity sections is disposed on a corresponding central portion of each pixel region of the first through fourth pixel regions; and a second impurity section disposed between the second pixel region and the fourth pixel region, wherein the first impurity sections have a conductivity type that is different from a conductivity type of the second impurity section.

According to some embodiments of the present inventive concepts, an image sensor may include: a semiconductor substrate includes first, second, third, and fourth pixel regions, wherein each of the first through fourth pixel regions includes first, second, third, and fourth photoelectric conversion sections; a pixel separation structure disposed in the semiconductor substrate and separating the first through fourth pixel regions from each other; and a plurality of subsidiary pixel separation structures disposed in the semiconductor substrate, wherein each subsidiary pixel separation structure of the plurality of subsidiary pixel separation structures is disposed on a corresponding central portion of each pixel region of the first through fourth pixel regions. The second pixel region is spaced apart from the first pixel region in a first direction, the fourth pixel region is spaced apart from the first pixel region in a second direction, wherein the second direction intersects the first direction. The semiconductor substrate includes: a plurality of first impurity sections, wherein each first impurity section of the plurality of impurity sections is disposed on a corresponding central portion of each pixel region of the first through fourth pixel regions; and a second impurity section disposed between the second pixel region and the fourth pixel region, wherein the plurality of subsidiary pixel separation structures is spaced apart from the pixel separation structure, and wherein each subsidiary pixel separation structure of the plurality of subsidiary pixel separation structures vertically overlaps each of the first impurity sections.

According to some embodiments of the present inventive concepts, an image sensor may include: a semiconductor substrate that includes first, second, third, and fourth pixel regions, wherein each of the first through fourth pixel regions include first, second, third, and fourth photoelectric conversion sections, and wherein the semiconductor substrate has a first surface and a second surface opposite to the first surface. The image sensor may further include a pixel separation structure disposed in the semiconductor substrate and separating the first through fourth pixel regions from each other; a plurality of gate electrodes disposed on the first surface, a plurality of wiring lines disposed on the first surface; and first, second, third, and fourth micro-lenses disposed on the second surface and respectively disposed in the first through fourth pixel regions, wherein the second pixel region is spaced apart from the first pixel region in a first direction, wherein the fourth pixel region is spaced apart from the first pixel region in a second direction, the second direction intersecting the first direction. The semiconductor substrate includes: a plurality of first impurity sections on corresponding central portions of the first through fourth pixel regions; a second impurity section between the second pixel region and the fourth pixel region; and a plurality of third impurity sections that electrically connect the first through fourth photoelectric conversion sections to each other, wherein the pixel separation structure includes: a plurality of first pixel separation parts that extend in the first direction and are spaced apart from each other; a plurality of second pixel separation parts that extend in the second direction and are spaced apart from each other, the second pixel separation parts intersecting the first pixel separation parts; and a plurality of protruding parts, wherein each protruding part in the plurality of protruding parts extends from a central portion of each of the first and second pixel separation parts toward the central portion of each of the first through fourth pixel regions. The impurities doped in the first impurity section may be different from impurities doped in the second impurity section.

DETAILED DESCRIPTION OF THE EMBODIMENTS

Figure 1:
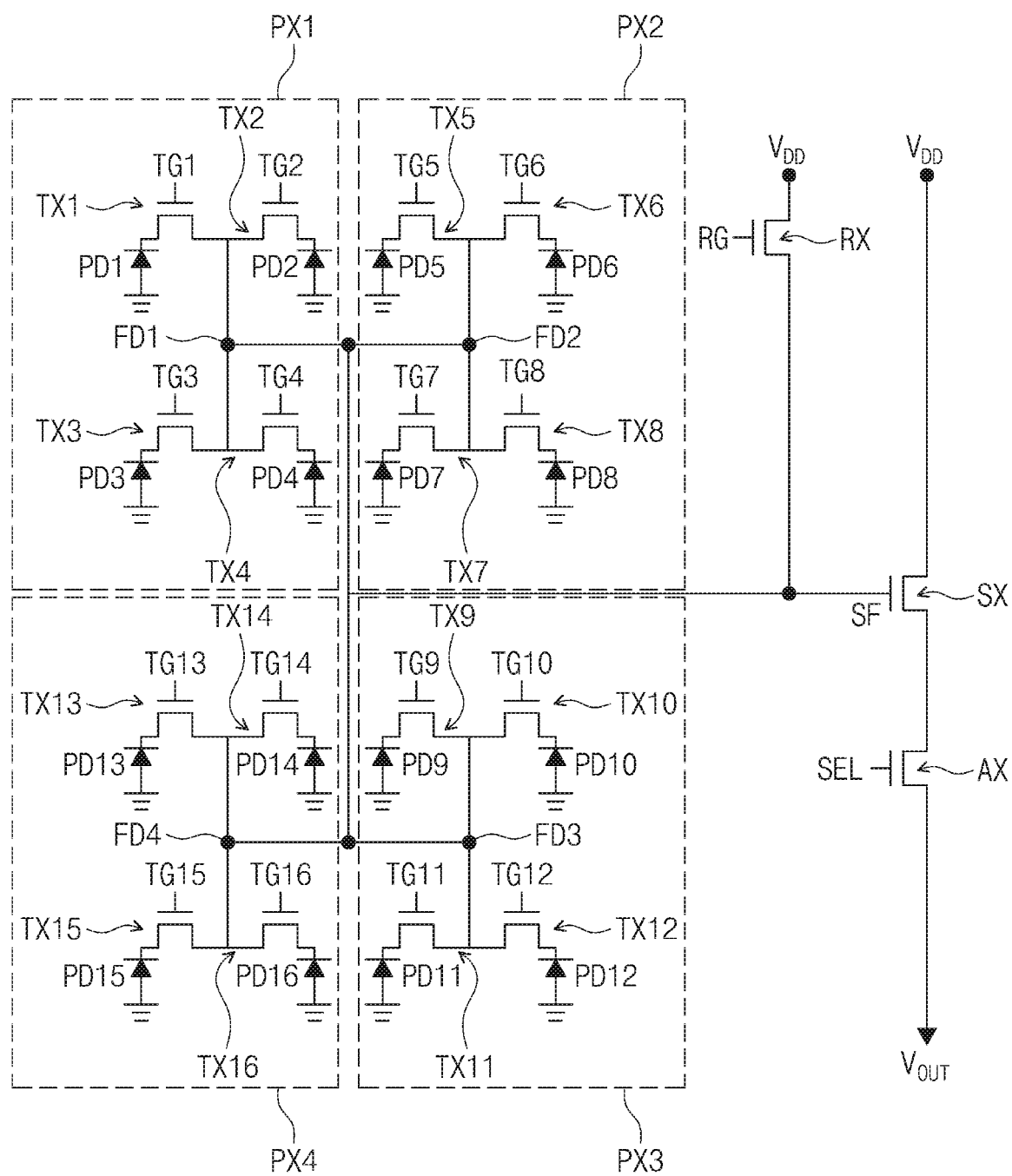
FIG. 1 illustrates a circuit diagram included in an image sensor according to some embodiments of the present inventive concepts.

The following will now describe in detail an image sensor according to some embodiments of the present inventive concepts and with reference the accompanying drawings. Like reference symbols in the drawings may denote like elements, and to the extent that a description of an element has been omitted, it may be understood that the element is at least similar to corresponding elements that are described elsewhere in the specification. Additionally, description of a singular element may apply to a plurality of the same elements, unless the context of the description or referenced drawings indicates otherwise.

FIG. 1 illustrates a circuit diagram included in an image sensor according to some embodiments of the present inventive concepts. For example, FIG. 1 shows a circuit diagram of one pixel region group PG according to some embodiments of the present inventive concepts.

Referring to FIG. 1, the pixel region group PG may include, for example, first, second, third, and fourth pixel regions PX1, PX2, PX3, and PX4. The pixel region group PG may include photoelectric conversion sections PD1 through PD16, first, second, third, and fourth floating diffusion sections FD1, FD2, FD3, and FD4, transfer transistors TX1 through TX16, a source follower transistor SX, a reset transistor RX, and a selection transistor AX. The transfer transistors TX1 through TX16, the source follower transistor SX, the reset transistor RX, and the selection transistor AX may respectively include transfer gates TG1 through TG16, a source follower gate SF, a reset gate RG, and a selection gate SEL.

For example, the first pixel region PX1 may include first through fourth photoelectric conversion sections PD1 through PD4, a first floating diffusion section FD1, and first through fourth transfer transistors TX1 through TX4; the second pixel region PX2 may include fifth through eighth photoelectric conversion sections PD5 through PD8, a second floating diffusion section FD2, and fifth through eighth transfer transistors TX5 through TX8; the third pixel region PX3 may include ninth through twelfth photoelectric conversion sections PD9 through PD12, a third floating diffusion section FD3, and ninth through twelfth transfer transistors TX9 through TX12; and the fourth pixel region PX4 may include thirteenth through sixteenth photoelectric conversion sections PD13 through PD16, a fourth floating diffusion section FD4, and thirteenth through sixteenth transfer transistors TX13 through TX16.

The first through sixteenth photoelectric conversion sections PD1 through PD16 may be photodiodes, and may each include an n-type impurity section and a p-type impurity section. The first through fourth floating diffusion sections FD1 through FD4 may serve as drains of the first through sixteenth transfer transistors TX1 through TX16. The first through fourth floating diffusion sections FD1 through FD4 may be electrically connected to each other. For example, the first floating diffusion section FD1 may serve as a drain for each of the first through fourth transfer transistors TX1 through TX4, the second floating diffusion section FD2 may serve as a drain for each of the fifth through eighth transfer transistors TX5 through TX8, the third floating diffusion section FD3 may serve as a drain for each of the ninth through twelfth transfer transistors TX9 through TX12, and the fourth floating diffusion section FD4 may serve as a drain for each of the thirteenth through sixteenth transfer transistors TX13 through TX16.

The first through fourth floating diffusion sections FD1 through FD4 may serve as a source of the source follower transistor SX and a source of the reset transistor RX. The first through fourth floating diffusion sections FD1 through FD4 may be electrically connected to both the source follower gate SF of the source follower transistor SX and to the reset gate RG of the reset transistor RX. The source follower transistor SX may be connected to the selection transistor AX.

An example operation of the image sensor will be explained below with reference to FIG. 1. First, a power voltage $V_{DD}$ may be applied to a drain of the reset transistor RX and a drain of the source follower transistor SX under a light-blocked state, such that the reset transistor RX may be turned on to discharge charges that remain on the first through fourth floating diffusion sections FD1 through FD4. Thereafter, when the reset transistor RX is turned off and external light is incident on the first through sixteenth photoelectric conversion sections PD1 through PD16, electron-hole pairs may be generated from the first through sixteenth photoelectric conversion sections PD1 through PD16. Holes may be transferred to and accumulated on p-type impurity sections of the first through sixteenth photoelectric conversion sections PD1 through PD16, and electrons may be transferred to and accumulated on n-type impurity sections of the first through sixteenth photoelectric conversion sections PD1 through PD16. When the first through sixteenth transfer transistors TX1 through TX16 are turned on, charges such as electrons and holes may be transferred and accumulated on the first through fourth floating diffusion sections FD1 through FD4. A gate bias of the source follower transistor SX may change in proportion to the amount of accumulated charges, and this may bring about a variation in source potential of the source follower transistor SX. In this case, when the selection transistor AX is turned on, charges may be read out as signals transmitted through a column line.

A wiring line may be electrically connected to one or more of the transfer gate TG, the source follower gate SF, the reset gate RG, and the selection gate SEL. The wiring line may be configured to apply the power voltage $V_{DD}$ to the drain of the reset transistor RX or the drain of the source follower transistor SX. The wiring line may include a column line connected to the selection transistor AX. The wiring line will be discussed below.

FIG. 1 shows an example in which four photoelectric conversion sections electrically share one floating diffusion section, but embodiments of the present inventive concepts are not necessarily limited thereto. However, by sharing one floating diffusion section between multiple photoelectric conversion sections, the image sensor may have increased integration.

Figure 2:
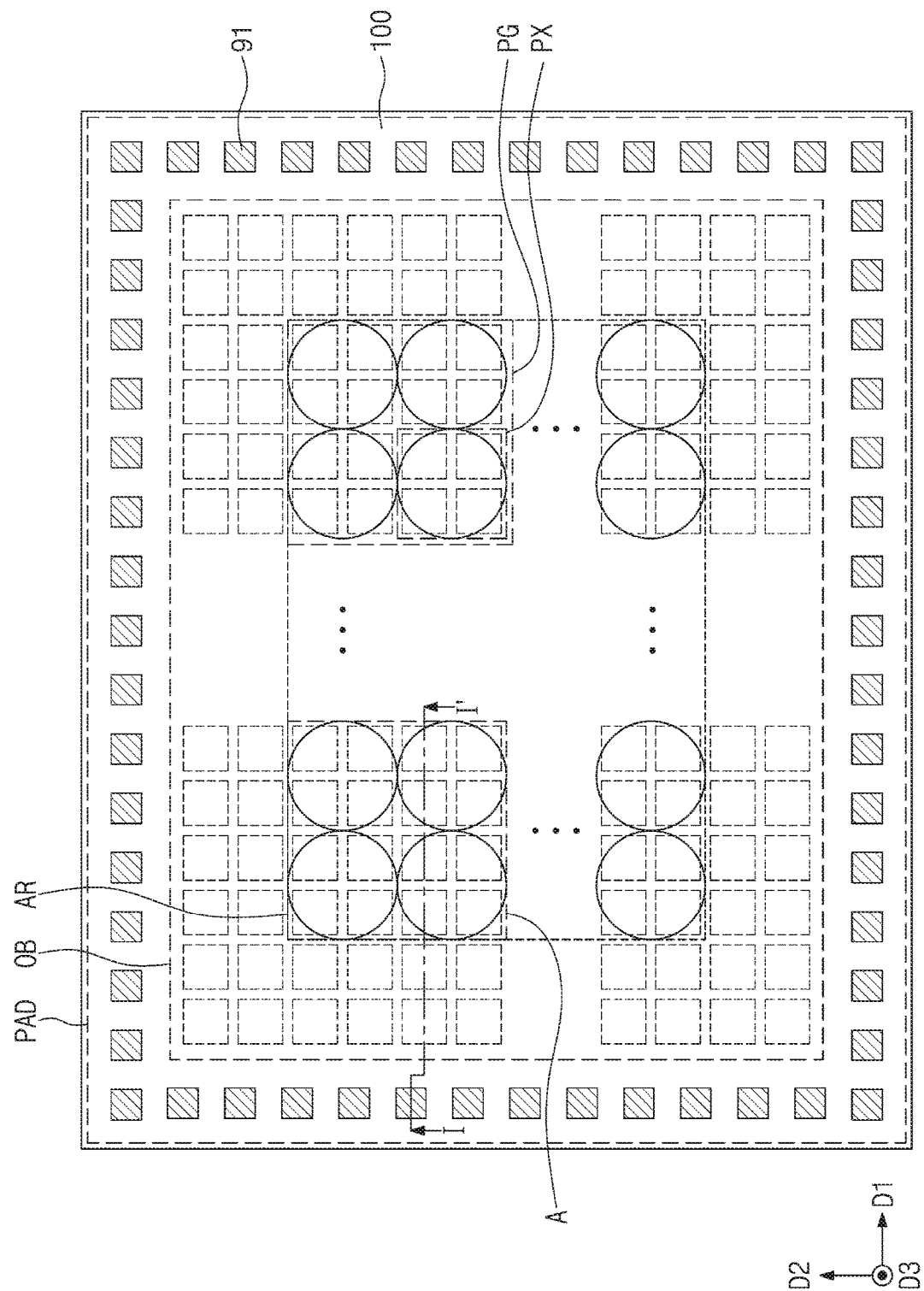
FIG. 2 illustrates a simplified plan view that shows an image sensor according to some embodiments of the present inventive concepts.
Figure 3:
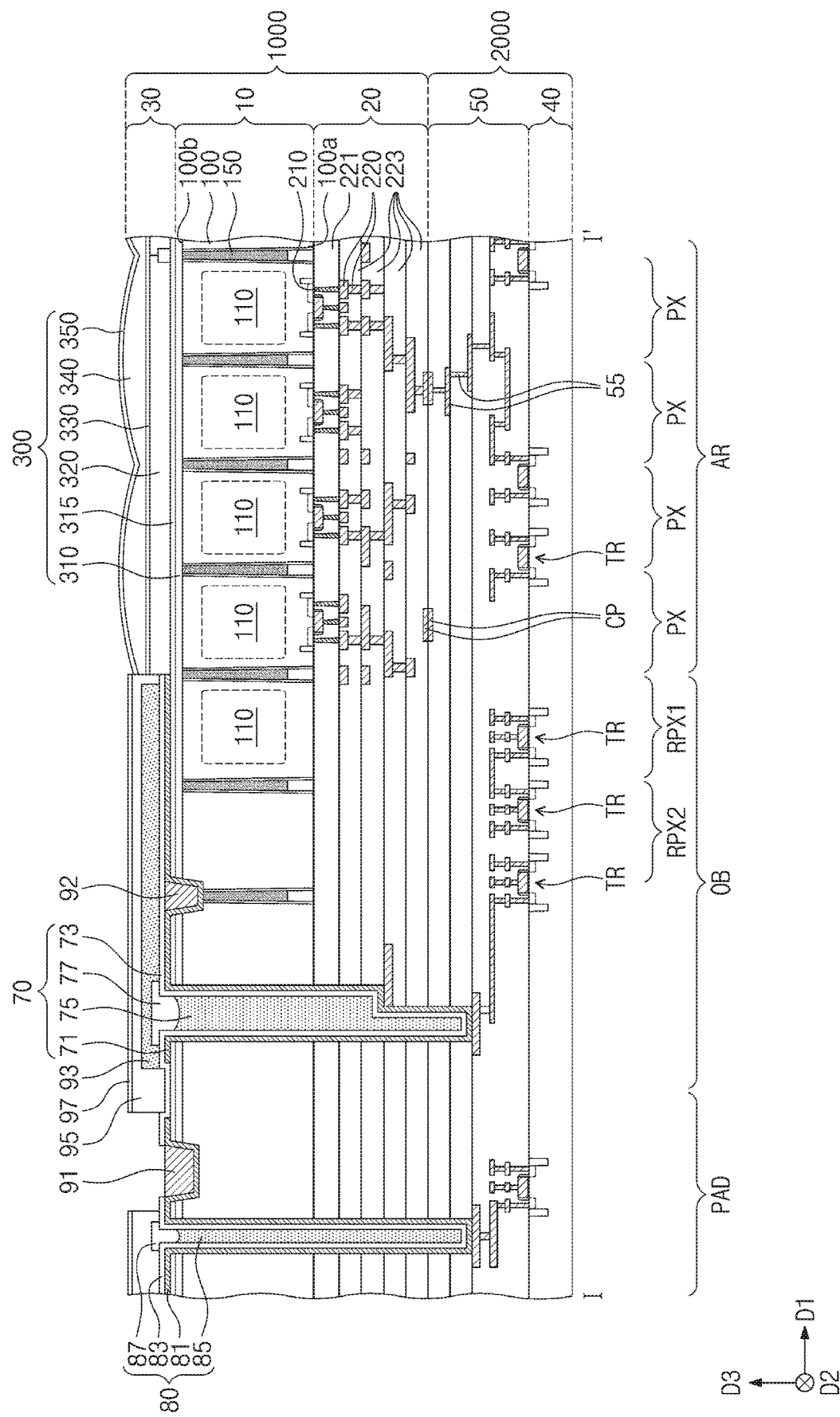
FIG. 3 illustrates a cross-sectional view taken along line I-I' of FIG. 2.

FIG. 2 illustrates a simplified plan view that shows an image sensor according to some embodiments of the present inventive concepts. FIG. 3 illustrates a cross-sectional view taken along line I-I' of FIG. 2.

Referring to FIGS. 2 and 3, an image sensor according to some embodiments may include a sensor chip 1000 and a circuit chip 2000. The sensor chip 1000 may include a photoelectric conversion layer 10, a first wiring layer 20, and an upper layer 30. The photoelectric conversion layer 10 may include a first substrate 100, a pixel separation structure 150, and first and second gate electrodes (see 171 and 181 of FIG. 4).

The first substrate 100 may include a pixel array area AR, an optical black area OB, and a pad area PAD. When viewed in plan, the pixel array area AR may be located on a central portion of the first substrate 100. The pixel array area AR may include a plurality of pixel region groups PG. Each of the pixel region groups PG may include a plurality of pixel regions PX. For example, each of the pixel region groups PG may include four pixel regions PX that are arranged in a two-by-two array. The pixel regions PX may output photoelectric signals in response to incident light. The pixel regions PX may be two-dimensionally arranged, for example, the pixel regions PX may be arranged in columns and rows. The rows may be parallel to a first direction D1. The columns may be parallel to a second direction D2. As used herein, the first direction D1 may be parallel to a first surface 100a of the first substrate 100, and the second direction D2 may be parallel to the first surface 100a of the first substrate 100 and intersect the first direction D1. For example, the second direction D2 may be substantially orthogonal to the first direction D1. A third direction D3 may intersect each of the first and second directions D1 and D2. For example, the third direction D3 may be a direction normal to the first surface 100a of the first substrate 100.

The pad area PAD may be provided on an edge portion of the first substrate 100, and when viewed in plan, may surround the pixel array area AR. The optical black area OB may be disposed between the pad area PAD and the pixel array area AR of the first substrate 100. When viewed in plan, the optical black area OB may surround the pixel array area AR. The pixel array area AR of the image sensor will now be further discussed in detail, and the optical black area OB, the pad area PAD, and the circuit chip 2000 will be explained later below.

Figure 4:
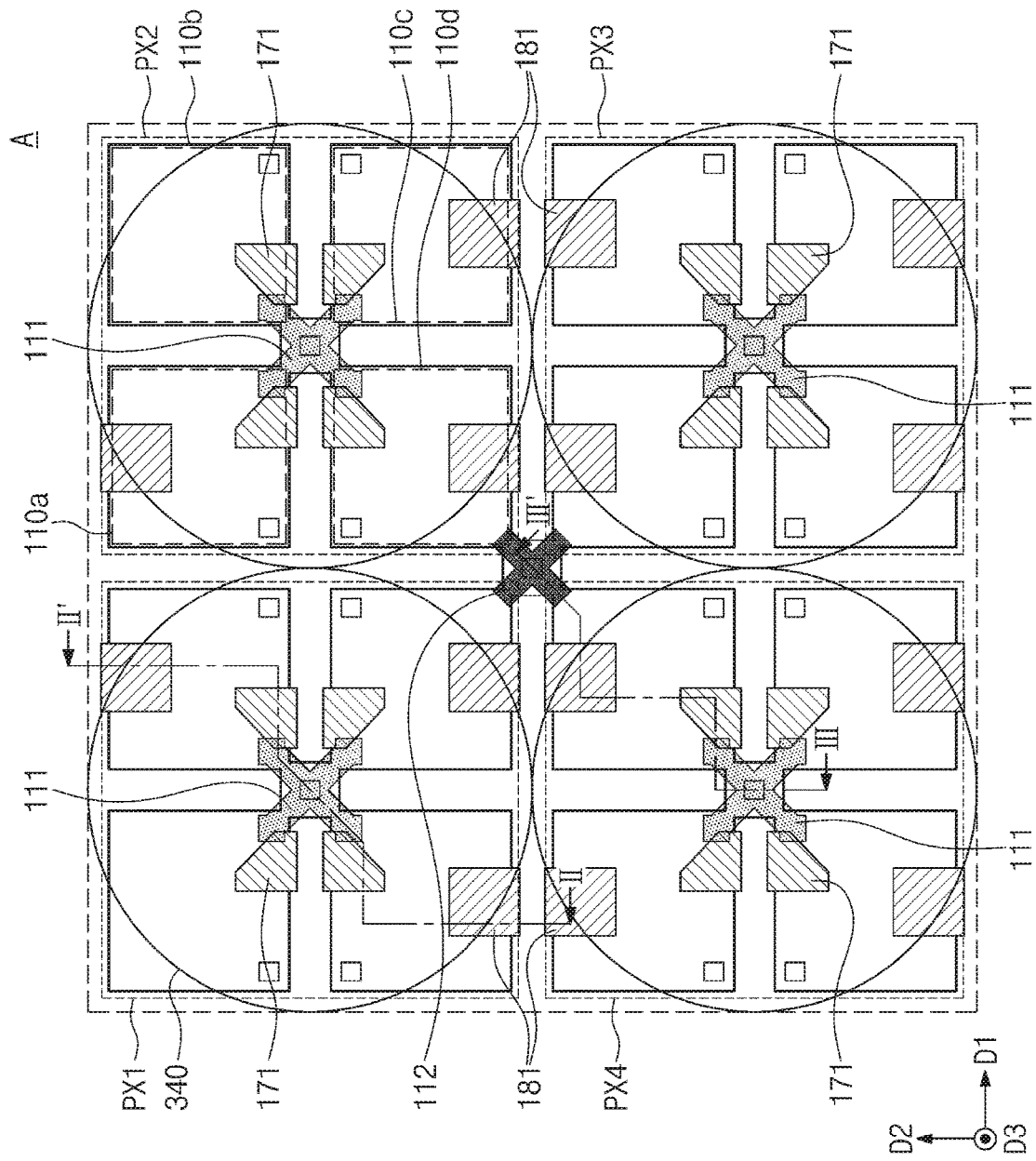
FIG. 4 illustrates an enlarged view that shows section A of FIG. 2.
Figure 5:
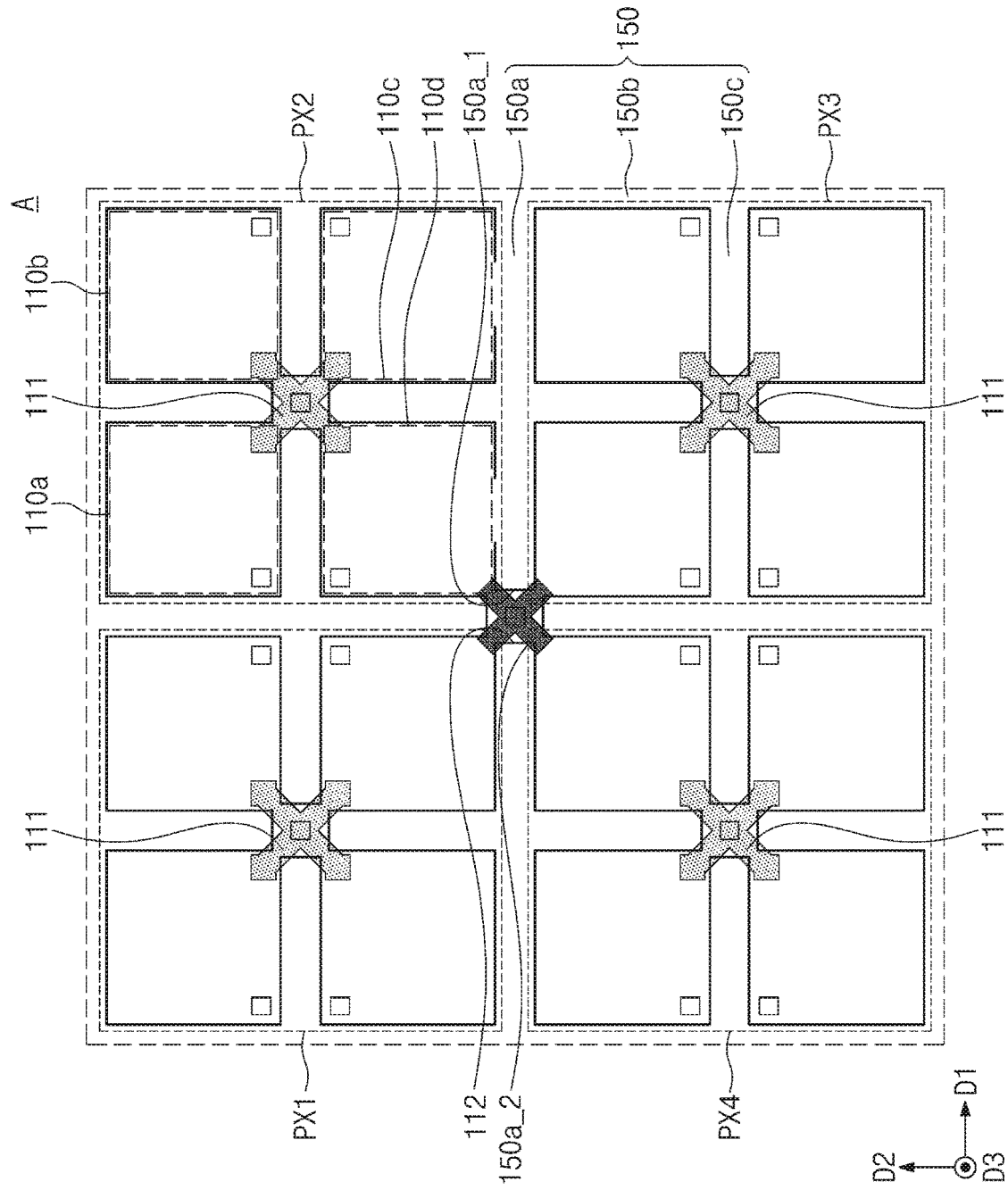
FIG. 5 illustrates a plan view that shows an image sensor according to some embodiments of the present inventive concepts, except gate electrodes and micro-lenses of FIG. 4.
Figure 6:
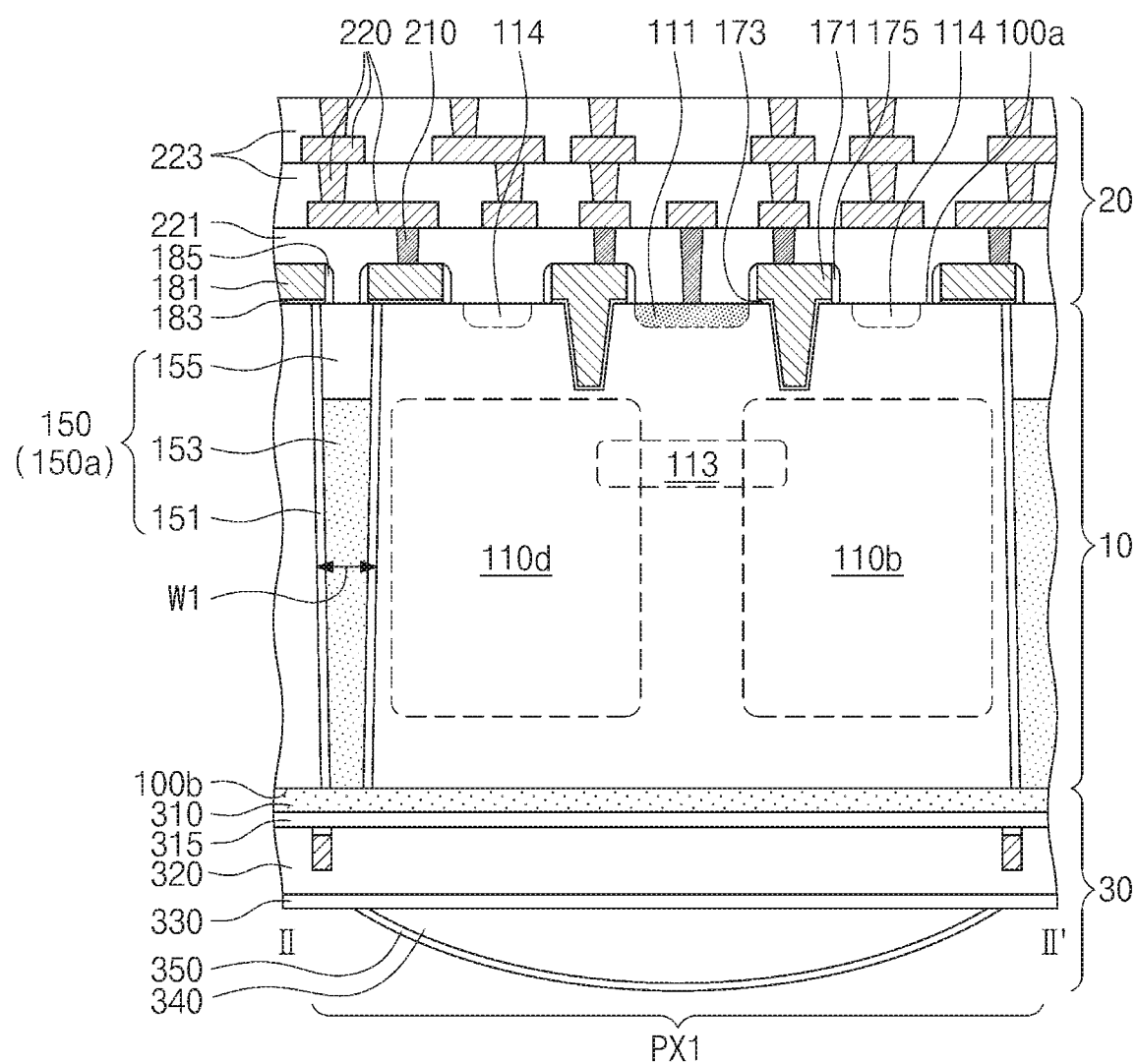
FIG. 6 illustrates a cross-sectional view taken along line II-II' of FIG. 4.
Figure 7:
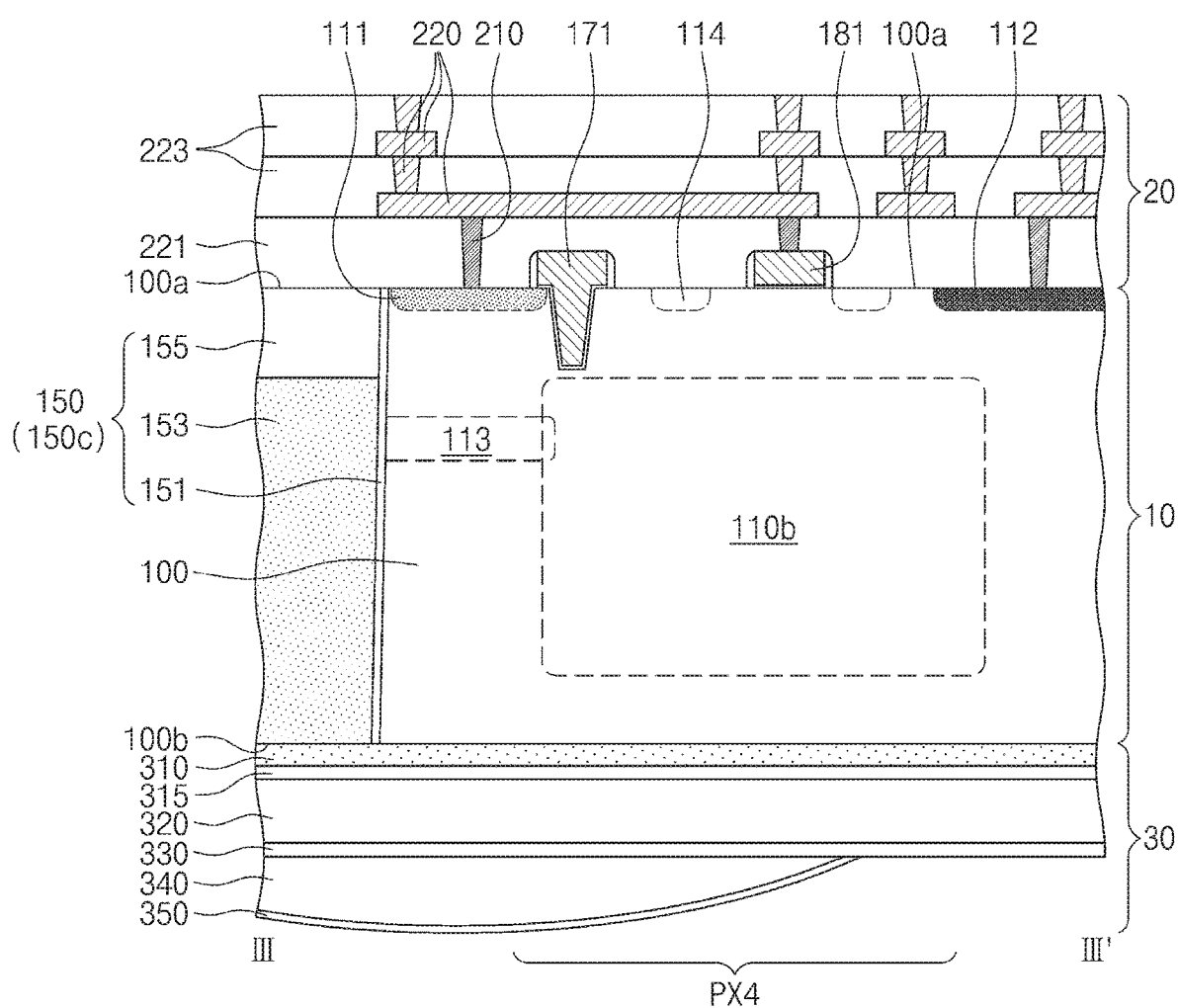
FIG. 7 illustrates a cross-sectional view taken along line of FIG. 4.

FIG. 4 illustrates an enlarged view that shows section A of FIG. 2. FIG. 5 illustrates a plan view that shows an image sensor according to some embodiments of the present inventive concepts. FIG. 6 illustrates a cross-sectional view taken along line II-IP of FIG. 4. FIG. 7 illustrates a cross-sectional view taken along line of FIG. 4.

Referring to FIG. 4 together with FIG. 2, the first substrate 100 may include a first surface 100a and a second surface 100b that are opposite to each other. The first substrate 100 may receive light that is incident on the second surface 100b. The first wiring layer 20 may be disposed on the first surface 100a of the first substrate 100, and the upper layer 30 may be disposed on the second surface 100b of the first substrate 100. The first substrate 100 may be a semiconductor substrate or a silicon-on-insulator (SOI) substrate. The first substrate 100 may include, for example, a silicon substrate, a germanium substrate, or a silicon-germanium substrate. The first substrate 100 may include first conductivity type impurities. For example, the first conductivity type impurities may include p-type impurities, such as aluminum (Al), boron (B), indium (In), and/or gallium (Ga).

The first substrate 100 may include a plurality of pixel region groups PG in the pixel array area AR. Each of the pixel region groups PG may be arranged in a matrix pattern along the first direction D1 and the second direction D2. Each of the pixel region groups PG may include a plurality of pixel regions, where each pixel region of the plurality of pixel regions is separated from other pixel regions by the pixel separation structure 150. For example, the plurality of pixel regions may include a first pixel region PX1, a second pixel region PX2, a third pixel region PX3, and a fourth pixel region PX4. A single pixel region group PG will be explained below for convenience of description.

As shown in FIG. 4, the first, second, third, and fourth pixel regions PX1, PX2, PX3, and PX4 may be spaced apart from each other across the pixel separation structure 150. The first, second, third, and fourth pixel regions PX1, PX2, PX3, and PX4 may be arranged in a two-by-two array. For example, the first and second pixel regions PX1 and PX2 may be aligned in the first direction D1, and the first and fourth pixel regions PX1 and PX4 may be aligned in the second direction D2. The first and third pixel regions PX1 and PX3 may be aligned neither in the first direction D1 nor in the second direction D2. The second and third pixel regions PX2 and PX3 may be aligned in the second direction D2, and the third and fourth pixel regions PX3 and PX4 may be aligned in the first direction D1. Each of the first, second, third, and fourth pixel regions PX1, PX2, PX3, and PX4 may have a width of about 1 µm to about 1.4 µm in the first direction D1.

The first, second, third, and fourth pixel regions PX1, PX2, PX3, and PX4 may each include a first photoelectric conversion section 110a, a second photoelectric conversion section 110b, a third photoelectric conversion section 110c, and a fourth photoelectric conversion section 110d. On each of the first, second, third, and fourth pixel regions PX1, PX2, PX3, and PX4, the first, second, third, and fourth photoelectric conversion sections 110a, 110b, 110c, and 110d may be spaced apart from each other across the pixel separation structure 150. The first, second, third, and fourth photoelectric conversion sections 110a, 110b, 110c, and 110d may be arranged in a two-by-two array. For example, the first and second photoelectric conversion sections 110a and 110b may be aligned in the first direction D1, and the first and fourth photoelectric conversion sections 110a and 110d may be aligned in the second direction D2. The first and third photoelectric conversion sections 110a and 110c may be aligned neither in the first direction D1 nor in the second direction D2. The second and third photoelectric conversion sections 110b and 110c may be aligned in the second direction D2, and the third and fourth photoelectric conversion sections 110c and 110d may be aligned in the first direction D1.

The first and second photoelectric conversion sections 110a and 110b may detect a difference in phase of incident light across the first direction D1. The third and fourth photoelectric conversion sections 110c and 110d may similarly detect a difference in phase of incident light across the first direction D1. When comparing signals that are output from the first and second photoelectric conversion sections 110a and 110b and/or from the third and fourth photoelectric conversion sections 110c and 110d, it may be possible to determine an autofocus signal that adjusts a position of one or more lenses. The first and fourth photoelectric conversion sections 110a and 110d may detect a difference in phase of incident light across the second direction D2. The second and third photoelectric conversion sections 110b and 110c may similarly detect a difference in phase of incident light across the second direction D2. When comparing signals that are output from the first and fourth photoelectric conversion sections 110a and 110d and/or from the second and third photoelectric conversion sections 110b and 110c, it may be possible to determine an autofocus signal that adjusts a position one or more lenses.

The first, second, third, and fourth photoelectric conversion sections 110a, 110b, 110c, and 110d may be doped with second conductivity type impurities. The second conductivity type impurities may have a conductivity type opposite to that of the first conductivity type impurities. For example, the second conductivity type impurities may allow the regions on which they are disposed to accumulate negative charges, while the first conductivity type impurities may allow the regions on which they are disposed to accumulate positive charges in the form of "holes" (e.g., the absence of electrons). The second conductivity type impurities may include n-type impurities, such as one or more of phosphorus, arsenic, bismuth, and antimony. The first, second, third, and fourth photoelectric conversion sections 110a, 110b, 110c, and 110d may be adjacent to the first surface 100a of the first substrate 100. For example, the first, second, third, and fourth photoelectric conversion sections 110a, 110b, 110c, and 110d may be disposed closer to the first surface 100a that to the second surface 100b. For example, each of the first through fourth photoelectric conversion sections 110a through 110d may include a first zone adjacent to the first surface 100a and a second zone adjacent to the second surface 100b. Each of the first through fourth photoelectric conversion sections 110a through 110d may have a difference in impurity concentration between the first zone and the second zone. Therefore, each of the first through fourth photoelectric conversion sections 110a through 110d may have a potential slope between the first and second surfaces 100a and 100b of the first substrate 100. Alternatively, each of the first through fourth photoelectric conversion sections 110a through 110d may have no potential slope between the first and second surfaces 100a and 100b of the first substrate 100.

The first substrate 100 and the first, second, third, and fourth photoelectric conversion sections 110a, 110b, 110c, and 110d may constitute a photodiode. For example, a photodiode may be constituted by a p-n junction between the first substrate 100 of the first conductivity type and each of the first, second, third, and fourth photoelectric conversion sections 110a, 110b, 110c and 110d of the second conductivity type. The first, second, third, and fourth photoelectric conversion sections 110a, 110b, 110c, and 110d in a given photodiode may generate and accumulate photo-charges in proportion to intensity of incident light.

Referring to FIG. 5, the pixel separation structure 150 may be provided in the first substrate 100. When viewed in plan, the pixel separation structure 150 may include first pixel separation parts 150a that extend in the first direction D1, second pixel separation parts 150b that extend in the second direction D2, and protruding parts 150c. The pixel separation structure 150 may define the first, second, third, and fourth pixel regions PX1, PX2, PX3, and PX4. The pixel separation structure 150 may additionally separate the first, second, third, and fourth photoelectric conversion sections 110a, 110b, 110c, and 110d of each pixel region from each other. For example, a single pixel region may be defined by a pair of first pixel separation parts 150a and a pair of second pixel separation parts 150b.

The first pixel separation parts 150a may be portions of the pixel separation structure 150 that extend in the first direction D1. For example, the first pixel separation parts 150a may extend in the first direction D1, while intersecting the second pixel separation parts 150b. The first pixel separation parts 150a may be spaced apart from each other in the second direction D2. The first pixel separation parts 150a may be disposed on edge areas of the first, second, third, and fourth pixel regions PX1, PX2, PX3, and PX4. The first pixel separation parts 150a may be connected to both the second pixel separation parts 150b and the protruding parts 150c adjacent to the first pixel separation parts 150a. Each of the first pixel separation parts 150a may be disposed between pixel regions that are adjacent to each other in the second direction D2, thereby separating the adjacent pixel regions from each other in the second direction D2.

The second pixel separation parts 150b may be portions of the pixel separation structure 150 that extend in the second direction D2. For example, the second pixel separation parts 150b may extend in the second direction D2, while intersecting the first pixel separation parts 150a. The second pixel separation parts 150b may be spaced apart from each other in the first direction D1. The second pixel separation parts 150b may be disposed on edge areas of the first, second, third, and fourth pixel regions PX1, PX2, PX3, and PX4. The second pixel separation parts 150b may be connected to both the first pixel separation parts 150a and the protruding parts 150c adjacent to the second pixel separation parts 150b. Each of the second pixel separation parts 150b may be disposed between pixel regions that are adjacent to each other in the first direction D1, thereby separating the adjacent pixel regions from each other in the first direction D1.

Four protruding parts 150c may be provided on each of the first, second, third, and fourth pixel regions PX1, PX2, PX3, and PX4. For example, four protruding parts 150c of the first pixel region PX1 may extend toward a central portion of the first pixel region PX1 from the edges of the first pixel region PX1 adjacent to the first pixel separation parts 150a and the second pixel separation parts 150b. For example, the four protruding parts 150c of a given pixel region may extend from approximate midpoints of the surrounding first and second pixel separation parts 150a and 150b inwardly towards a central portion of the given pixel region. The four protruding parts 150c may not extend fully to the central portion of the first pixel region PX1, as shown in FIG. 5. The four protruding parts 150c may connect the first pixel separation parts 150a to the second pixel separation parts 150b adjacent to the first pixel separation parts 150a. One pair of the protruding parts 150c among the four protruding parts 150c may extend in the first direction D1, and the other pair of the protruding parts 150c among the four protruding parts 150c may extend in the second direction D2. The four protruding parts 150c may be spaced apart from each other. Fourth protruding parts 150c on each of the second, third, and fourth pixel regions PX2, PX3, and PX4 may have the same structure as that of the fourth protruding parts 150c of the first pixel region PX1.

When viewed in plan, the first pixel separation parts 150a and the second pixel separation parts 150b may be integrally connected to each other to form a grid structure. Therefore, the first pixel separation parts 150a and the second pixel separation parts 150b may define the first, second, third, and fourth pixel regions PX1, PX2, PX3, and PX4. The protruding parts 150c may be interposed between the first, second, third, and fourth photoelectric conversion sections 110a, 110b, 110c, and 110d of each of the first, second, third, and fourth pixel regions PX1, PX2, PX3, and PX4. The first pixel separation parts 150a, the second pixel separation parts 150b, and the protruding parts 150c may surround each of the first, second, third, and fourth pixel regions PX1, PX2, PX3, and PX4.

In a pixel region group PG, neither the first pixel separation part 150a nor the second pixel separation part 150b may be provided on a central portion of the pixel region group PG. For example, the pixel region group PG may have a central portion where the first pixel separation parts extending in the first direction D1 are disconnected. Further, in the same central portion, the second pixel separation parts extending in the second direction D2 may also be disconnected. Therefore, neither the first pixel separation part 150a nor the second pixel separation part 150b may be provided on the central portion of the pixel region group PG. For example, a pair of first pixel separation parts 150a adjacent to the central portion of the pixel region group PG may have ends 150a_1 and 150a_2 that face each other. A pair of second pixel separation parts 150b adjacent to the central portion of the pixel region group PG may also have ends that face each other.

In some embodiments, the term "center (or central portion)" of one of the first, second, third, and fourth pixel regions PX1, PX2, PX3, and PX4 may indicate a point located at the same distance from each of the first and second pixel separation parts 150a and 150b that surround the one of the first, second, third, and fourth pixel regions PX1, PX2, PX3, and PX4. The language "center (or central portion)" of the pixel region group PG may denote a point or region that is located at the same distance from each of the first and second pixel separation parts 150a and 150b that surround the pixel region group PG.

Referring to FIG. 6, the pixel separation structure 150 may be provided in the first substrate 100. The pixel separation structure 150 may be provided in a first trench TR1, and the first trench TR1 may be recessed from the first surface 100a of the first substrate 100. The pixel separation structure 150 may extend from the first surface 100a toward the second surface 100b and penetrate the first substrate 100. For example, the pixel separation structure 150 may have a width W1 that progressively decreases from the first surface 100a to the second surface 100b of the first substrate 100. The pixel separation structure 150 may be a deep trench isolation (DTI) layer. The pixel separation structure 150 may have a vertical height that is substantially the same as a vertical thickness of the first substrate 100.

The pixel separation structure 150 may include a dielectric pattern 151, a semiconductor pattern 153, and a capping pattern 155. The dielectric pattern 151 may be disposed along a sidewall of the first trench TR1. The dielectric pattern 151 may include, for example, one or more of silicon-based dielectric materials (e.g., silicon nitride, silicon oxide, and/or silicon oxynitride) and high-k dielectric materials (e.g., hafnium oxide and/or aluminum oxide). Alternatively, the dielectric pattern 151 may include a plurality of layers, and the plurality of layers may include materials that are different from each other. The dielectric pattern 151 may have a refractive index that is less than that of the first substrate 100. Accordingly, crosstalk may be prevented or reduced between the first, second, third, and fourth pixel regions PX1, PX2, PX3, and PX4 of the first substrate 100.

The semiconductor pattern 153 may be provided in the first trench TR1. The semiconductor pattern 153 may fill the first trench TR1. A sidewall of the semiconductor pattern 153 may be surrounded by the dielectric pattern 151. The dielectric pattern 151 may be interposed between the semiconductor pattern 153 and the first substrate 100. Accordingly, the dielectric pattern 151 may separate the semiconductor pattern 153 from the first substrate 100. During operation of the image sensor, the semiconductor pattern 153 may be electrically separated from the first substrate 100 by the dielectric pattern 151. The semiconductor pattern 153 may include, for example, one or more of silicon oxide, silicon nitride, silicon oxynitride, impurity-doped polycrystalline silicon, impurity-undoped polycrystalline silicon, amorphous silicon, and metallic materials. For example, when the semiconductor pattern 153 includes silicon doped with impurities, the impurities may include n-type or p-type impurities. When the semiconductor pattern 153 includes a metallic material, the metallic material may include tungsten.

The capping pattern 155 may be provided on a top surface of the semiconductor pattern 153. The capping pattern 155 may be disposed adjacent to the first surface 100a of the first substrate 100. The capping pattern 155 may have a top surface coplanar with the first surface 100a of the first substrate 100. The capping pattern 155 may have a bottom surface in contact with the top surface of the semiconductor pattern 153. The capping pattern 155 may include a non-conductive material. For example, the capping pattern 155 may include one or more of silicon-based dielectric materials (e.g., silicon nitride, silicon oxide, and/or silicon oxynitride) and high-k dielectric materials (e.g., hafnium oxide and/or aluminum oxide). Accordingly, the pixel separation pattern 150 may prevent photo-charges generated from light incident onto each of the pixel regions PX from drifting into neighboring first through fourth pixel regions PX1 to PX4. The pixel separation structure 150 may prevent crosstalk between the first, second, third, and fourth pixel regions PX1, PX2, PX3, and PX4.

Referring to FIGS. 5 to 7, the first substrate 100 may include first impurity sections 111 and a second impurity section 112. For example, a pixel group PG may contain multiple first impurity sections 111 and one second impurity section 112. The first impurity sections 111 and the second impurity section 112 may be disposed adjacent to the first surface 100a of the first substrate 100. The first and second impurity sections 111 and 112 may have their bottom surfaces that are spaced apart from the first, second, third, and fourth photoelectric conversion sections 110a, 110b, 110c, and 110d.

When viewed in plan as shown in FIG. 5, the first impurity sections 111 may be provided on corresponding central portions of the first, second, third, and fourth pixel regions PX1, PX2, PX3, and PX4. Each of the first impurity sections 111 may be disposed between pairs of neighboring protruding parts 150c. For example, a pair of protruding parts 150c, where each protruding part in the pair faces the other, may have a first impurity section 111 interposed therebetween. The first impurity sections 111 may be disposed adjacent to the first gate electrodes 171. The first impurity sections 111 may be doped with second conductivity type impurities. The second conductivity type impurities may include n-type impurities, such as one or more of phosphorus (P), arsenic (As), bismuth (Bi), and antimony (Sb).

The first, second, third, and fourth pixel regions PX1, PX2, PX3, and PX4 may each include a single first impurity section 111. Accordingly, a single pixel region group PG may include four first impurity sections 111. A top surface of each of the first impurity sections 111 may have an X shape. For example, when viewed in plan, each of the first impurity sections 111 may diagonally extend toward each of the first, second, third, and fourth photoelectric conversion sections 110a, 110b, 110c, and 110d from the center of its corresponding pixel region. Each of the first impurity sections 111 may vertically overlap a portion of each of the first, second, third, and fourth photoelectric conversion sections 110a, 110b, 110c, and 110d. The first impurity sections 111 may correspond to the first, second, third, and fourth floating diffusion sections FD1, FD2, FD3, and FD4 of FIG. 1.

When viewed in plan, the second impurity section 112 may be provided on the central portion of the pixel region group PG. For example, the second impurity section 112 may be disposed between a pair of first pixel separation parts 150a that are spaced apart from each other in the first direction D1. Further, the second impurity section 112 may be disposed between the ends 150a_1 and 150a_2 of the first pixel separation parts 150a that are adjacent to the central portion of the pixel region group PG. The second impurity section 112 may be doped with first conductivity type impurities. For example, the first conductivity type impurities may include p-type impurities, such as one or more of aluminum (Al), boron (B), indium (In), and gallium (Ga). The second impurity section 112 may serve as a ground section. The second impurity section 112 may include impurities whose conductivity type is the same as that of impurities doped in the first substrate 100, and is different from that of impurities doped in the first impurity section 111. In some embodiments, concentration of impurities doped in the second impurity section 112 may be greater than a concentration of impurities doped in the first substrate 100.

A single pixel region group PG may include a single second impurity section 112. A top surface of the second impurity section 112 may have an X shape. In detail, when viewed in plan, the second impurity section 112 may diagonally extend toward each of its adjacent first, second, third, and fourth photoelectric conversion sections 110a, 110b, 110c, and 110d which are adjacent to each other, and may form an "X" shape. For example, the second impurity section 112 may vertically overlap a portion of the third photoelectric conversion section 110c of the first pixel region PX1, a portion of the fourth photoelectric conversion section 110d of the second pixel region PX2, a portion of the first photoelectric conversion section 110a of the third pixel region PX3, and a portion of the second photoelectric conversion section 110b of the fourth pixel region PX4. In an alternative example, the second impurity section 112 may not vertically overlap any of the first, second, third, and fourth pixel regions PX1, PX2, PX3, and PX4.

Referring to FIGS. 4, 6, and 7, third impurity sections 113 may be further included in the first substrate 100 of the image sensor according to some embodiments. The third impurity sections 113 may vertically overlap corresponding first impurity sections 111. For example, the third impurity sections 113 may be provided on corresponding central portions of the first, second, third, and fourth pixel regions PX1, PX2, PX3, and PX4. Accordingly, the first, second, third, and fourth pixel regions PX1, PX2, PX3, and PX4 may each include a single third impurity section 113, and the pixel region group PG may include four third impurity sections 113. Each of the third impurity sections 113 may overlap the first, second, third, and fourth photoelectric conversion sections 110a, 110b, 110c, and 110d which are adjacent to each other. For example, when viewed in cross-section, each of the third impurity sections 113 may be located at a level between those of lowermost and uppermost portions of each of the first, second, third, and fourth photoelectric conversion sections 110a, 110b, 110c, and 110d.

Each of the third impurity sections 113 may electrically connect the first, second, third, and fourth photoelectric conversion sections 110a, 110b, 110c, and 110d which are adjacent to each other. The third impurity sections 113 may each be doped with second conductivity type impurities. The second conductivity type impurities may include n-type impurities, such as one or more of phosphorus (P), arsenic (As), bismuth (Bi), and antimony (Sb). The concentration of impurities doped in the third impurity section 113 may be the same or different from the concentration of impurities doped in each of the first, second, third, and fourth photoelectric conversion sections 110a, 110b, 110c, and 110d. The third impurity section 113 may serve as a channel through which electrons accumulated in one of the first, second, third, and fourth photoelectric conversion sections 110a, 110b, 110c, and 110d, and which can then be transmitted to another of the first, second, third, and fourth photoelectric conversion sections 110a, 110b, 110c, and 110d. Therefore, electrons may be evenly distributed and accumulated in the first, second, third, and fourth photoelectric conversion sections 110a, 110b, 110c, and 110d, and accordingly there may be an increase in full well capacity of the pixel regions. For example, the number of electrons that can be stored within each of the first, second, third, and fourth pixel regions PX1, PX2, PX3, and PX4 in an image sensor according to the present disclosure may be increased. Accordingly, the image sensor may have increased operating characteristics.

Referring back to FIGS. 6 and 7, fourth impurity sections 114 may further be included in the first substrate 100 of the image sensor according to some embodiments. The fourth impurity sections 114 may each be provided between the first gate electrode 171 and the second gate electrode 181. The fourth impurity sections 114 may be disposed adjacent to the first surface 100a of the first substrate 100. For example, the fourth impurity sections may contact the first surface 100a of the first substrate 100. When viewed in plan, each of the fourth impurity sections 114 may extend along the first direction D1 between the first gate electrode 171 and the second gate electrode 181. The fourth impurity sections 114 may be doped with first conductivity type impurities. For example, the first conductivity type impurities may include p-type impurities, such as one or more of aluminum (Al), boron (B), indium (In), and gallium (Ga). The fourth impurity sections 114 may include the same impurity as that of the first substrate 100. However, in some examples, the concentration of impurities doped in the fourth impurity section 114 may be greater than the concentration of impurities doped in the first substrate 100. The fourth impurity sections 114 may prevent a current leakage between second-conductivity-type impurity doped sections that are disposed around the first gate electrode 171 and second-conductivity-type impurity doped sections that are disposed around the second gate electrode 181, thereby increasing dielectric properties. In addition, the image sensor according to some embodiments may include the fourth impurity sections 114 as an alternative to shallow trench isolation (STI) layers. When a plurality of shallow trench isolation layers is present, dark current may be increased, which may reduce the operating characteristics of the image sensor. The image sensor according to some embodiments may be configured such that the fourth impurity sections 114 are included to reduce dark current and to increase operating characteristics.

Referring still to FIGS. 6 and 7, the first wiring layer 20 may be provided on the first surface 100*a* of the first substrate 100. The first wiring layer 20 may include dielectric layers 221 and 223 and conductive structures 210 and 220. The dielectric layers 221 and 223 may include a first dielectric layer 221 and second dielectric layers 223. The first dielectric layer 221 may cover the first surface 100*a* of the first substrate 100. For example first dielectric layer 221 may be disposed on the first surface 100*a* of the first substrate 100, and may cover the gate electrodes 171 and 181. The second dielectric layers 223 may be stacked on the first dielectric layer 221. The first and second dielectric layers 221 and 223 may include a non-conductive material. For example, the first and second dielectric layers 221 and 223 may include a silicon-based dielectric material, such as silicon oxide, silicon nitride, and/or silicon oxynitride. The conductive structures 210 and 220 may be disposed in the dielectric layers 221 and 223. The conductive structures 210 and 220 may include a contact plug part 210 and a wiring line part 220. The wiring line part 220 may include, for example, a line pattern and a via pattern. The contact plug part 210 may be provided in the first dielectric layer 221, and may be electrically connected to one of the first gate electrode 171, the second gate electrode 181, the first impurity section 111, and the second impurity section 112. The wiring line part 220 of the conductive structures 210 and 220 may be interposed between two neighboring dielectric layers 221 and 223. The wiring line part 220 may be connected to the contact plug part 210. The via pattern of the conductive structures 210 and 220 may penetrate at least one of the second dielectric layers and may be electrically connected to line pattern. The contact plug part 210 of the conductive structures 210 and 220 may include a different material than that of the line pattern and the via pattern. The line pattern and the via pattern may include a metallic material, such as copper (Cu), and the contact plug part 210 may include tungsten.

A light-receiving part 300 may be provided on the second surface 100*b* of the first substrate 100. For example, the light-receiving part 300 may be placed on the pixel array area AR of the first substrate 100. The light-receiving part 300 may include a first backside dielectric layer 310, an antireflection layer 315, color filters 320, a second backside dielectric layer 330, micro-lenses 340, and a lens coating layer 350. The light-receiving part 300 may focus and filter incident light thereon, and accordingly the photoelectric conversion layer 10 may be provided with the focused and filtered light.

For example, the color filters 320 and the micro-lenses 340 may be disposed on the second surface 100*b* of the first substrate 100. The color filters 320 may be disposed on the first, second, third, and fourth pixel regions PX1, PX2, PX3, and PX4. The micro-lenses 340 may be disposed on the color filters 320. The antireflection layer 315 may be disposed between the color filters 320 and the second surface 100*b* of the first substrate 100. The antireflection layer 315 may prevent reflection of light in order to allow a larger amount of light incident on the second surface 100*b* of the first substrate 100 to reach the first, second, third, and fourth photoelectric conversion sections 110*a*, 110*b*, 110*c*, and 110*d*. The first backside dielectric layer 310 may be provided between the antireflection layer 315 and the second surface 100*b* of the first substrate 100. The second backside dielectric layer 330 may be provided between the color filters 320 and the micro-lenses 340. The second backside dielectric layer 330 may include a fixed charge layer, an adhesive layer, and/or a passivation layer. In some embodiments, the second backside dielectric layer 330 may include a plurality of layers, and may include metal oxide (e.g., aluminum oxide or hafnium oxide) or silicon-based dielectric materials (e.g., silicon oxide or silicon nitride).

The color filters 320 may include primary color filters. The color filters 320 may include first, second, and third color filters that are transparent to different colors. For example, the first, second, and third color filters may be respectively transparent to green light, red light, and blue light. The first, second, and third color filters may be arranged in a Bayer pattern format. In other embodiments, the first, second, and third color filters may be transparent to other colors such as cyan, magenta, or yellow.

The color filters 320 may be correspond to a plurality of pixel region groups PG. For example, one of the first, second, and third color filters may be disposed on one pixel region group PG. For example, one of the first, second, and third color filters may be provided on all of the first, second, third, and fourth pixel regions PX1, PX2, PX3, and PX4, and may cover all of the first, second, third, and fourth pixel regions PX1, PX2, PX3, and PX4 of the pixel region group PG depicted in FIG. 4. Therefore, the first, second, third, and fourth pixel regions PX1, PX2, PX3, and PX4 may output a signal corresponding to an intensity of one of green light, red light, and blue light.

The micro-lenses 340 may be disposed on the color filters 320. Four micro-lenses 340 may be placed on one of the color filters 320. For example, four micro-lenses 340 may vertically overlap corresponding first, second, third, and fourth pixel regions PX1, PX2, PX3, and PX4. The micro-lenses 340 may be connected to each other. The micro-lenses 340 may be transparent to visible light. The micro-lenses 340 may have convex shapes to condense light incident on the first, second, third, and fourth pixel regions PX1, PX2, PX3, and PX4. The micro-lenses 340 may include an organic material. For example, the micro-lenses 340 may include a photoresist material and/or a thermosetting resin.

The lens coating layer 350 may be provided on surfaces of the micro-lenses 340. The lens coating layer 350 may conformally cover convex surfaces of the micro-lenses 340. The lens coating layer 350 may include a dielectric material and may be transparent to visible light. The lens coating layer 350 may protect the micro-lenses 340.

Figure 8:
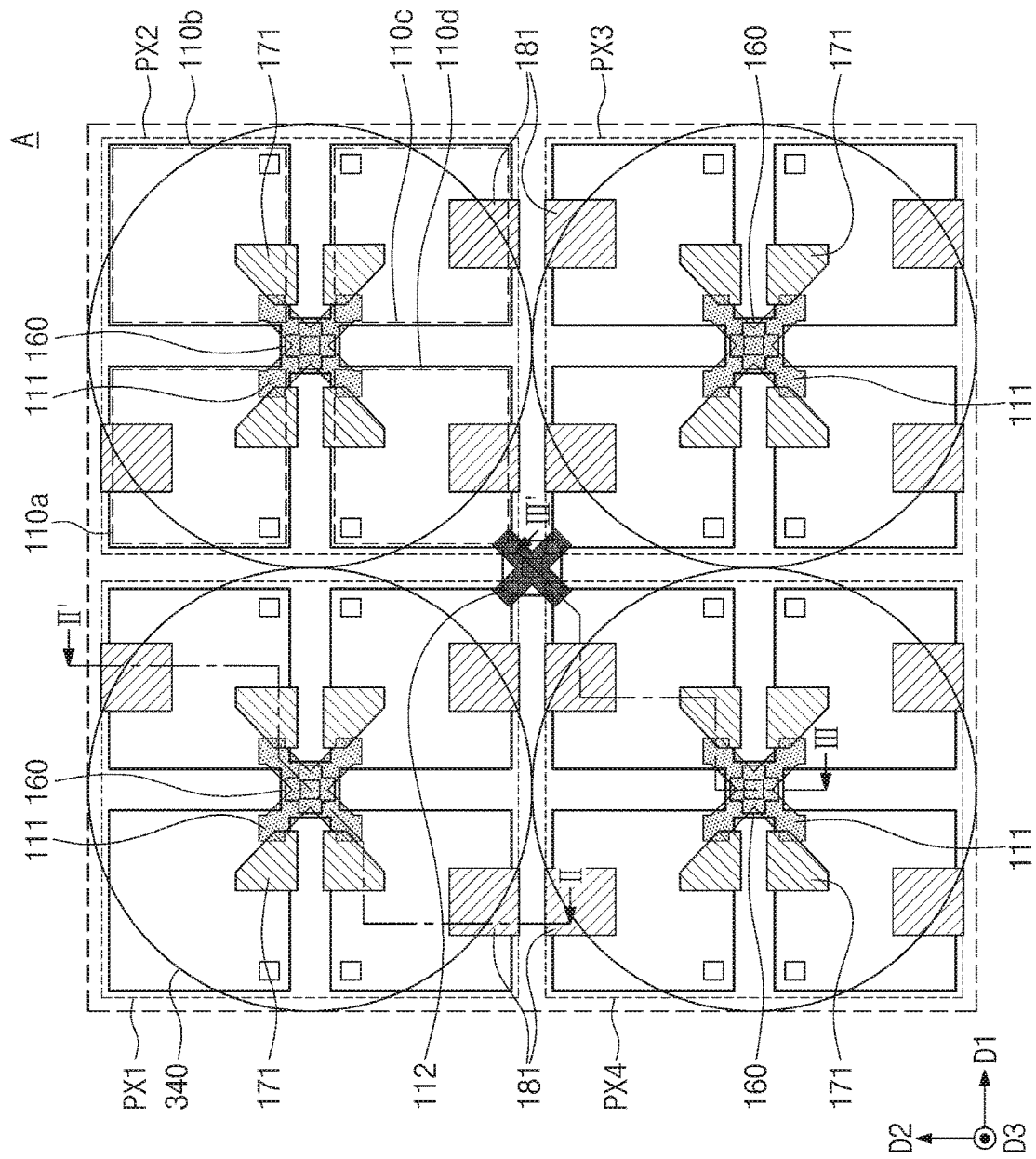
FIG. 8 illustrates a plan view of section A depicted in FIG. 2, that shows an image sensor according to some embodiments of the present inventive concepts.
Figure 9:
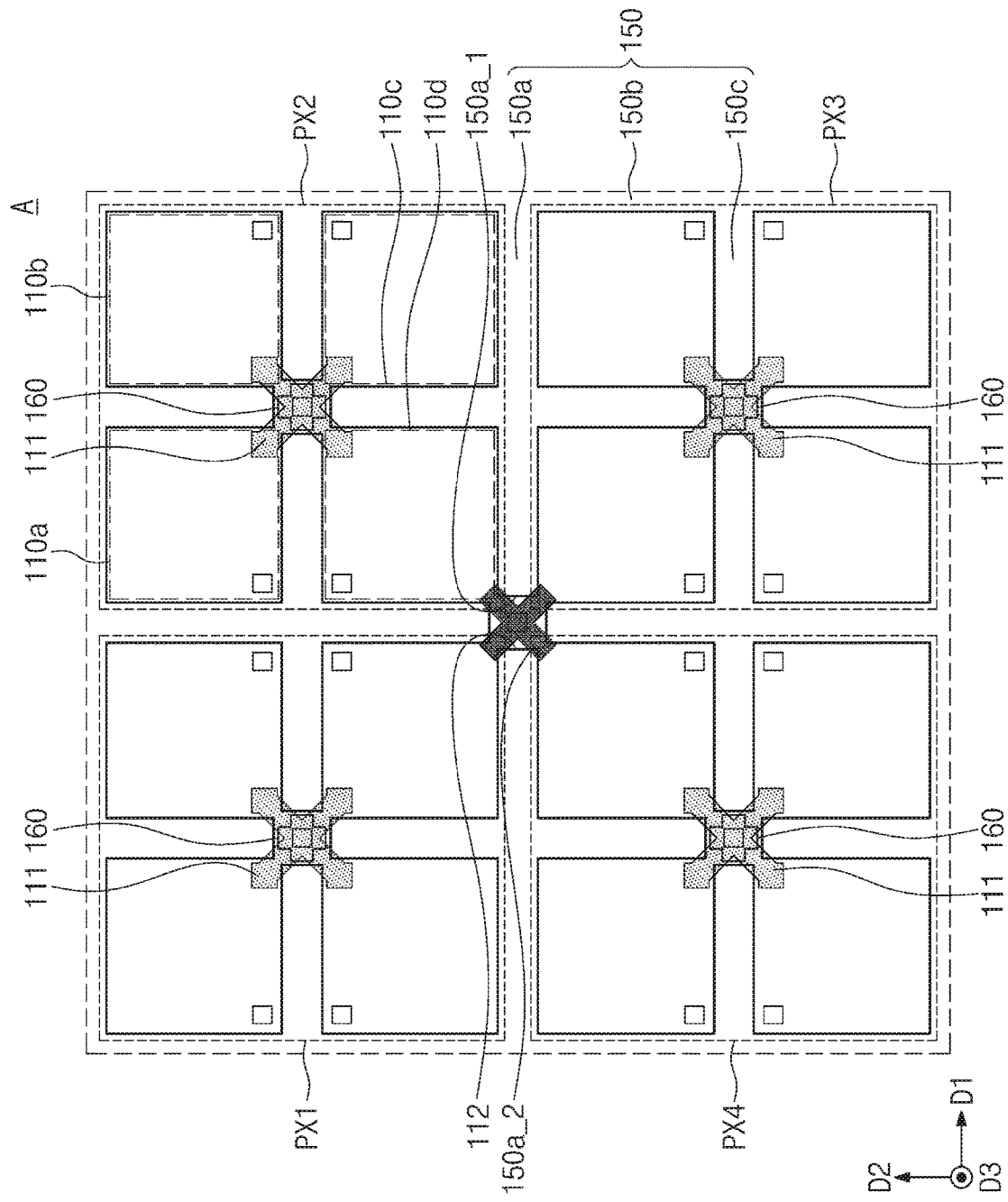
FIG. 9 illustrates a plan view that shows an image sensor according to some embodiments of the present inventive concepts, except gate electrodes and micro-lenses of FIG. 8.
Figure 10:
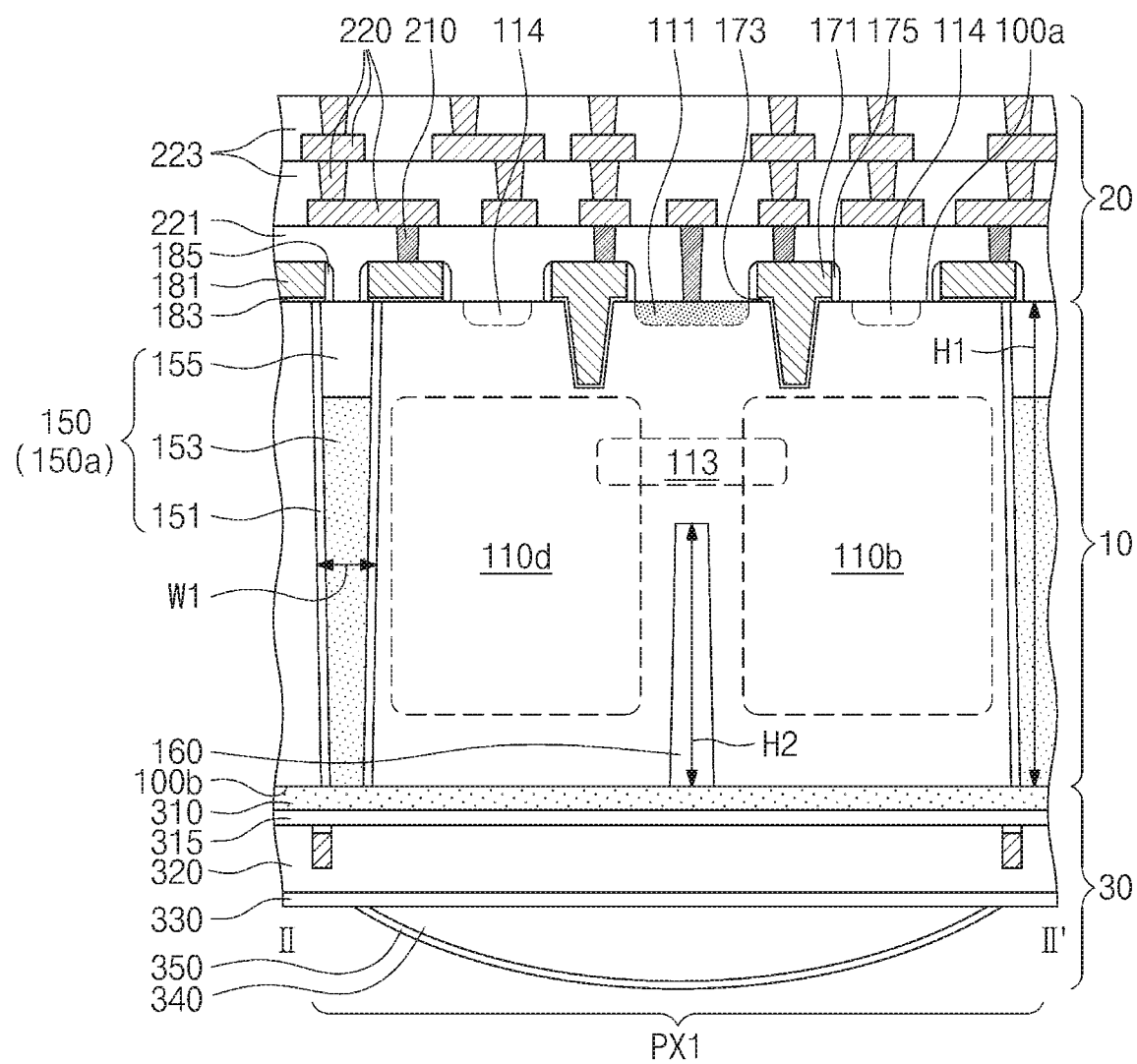
FIG. 10 illustrates a cross-sectional view taken along line IV-IV' of FIG. 8.
Figure 11:
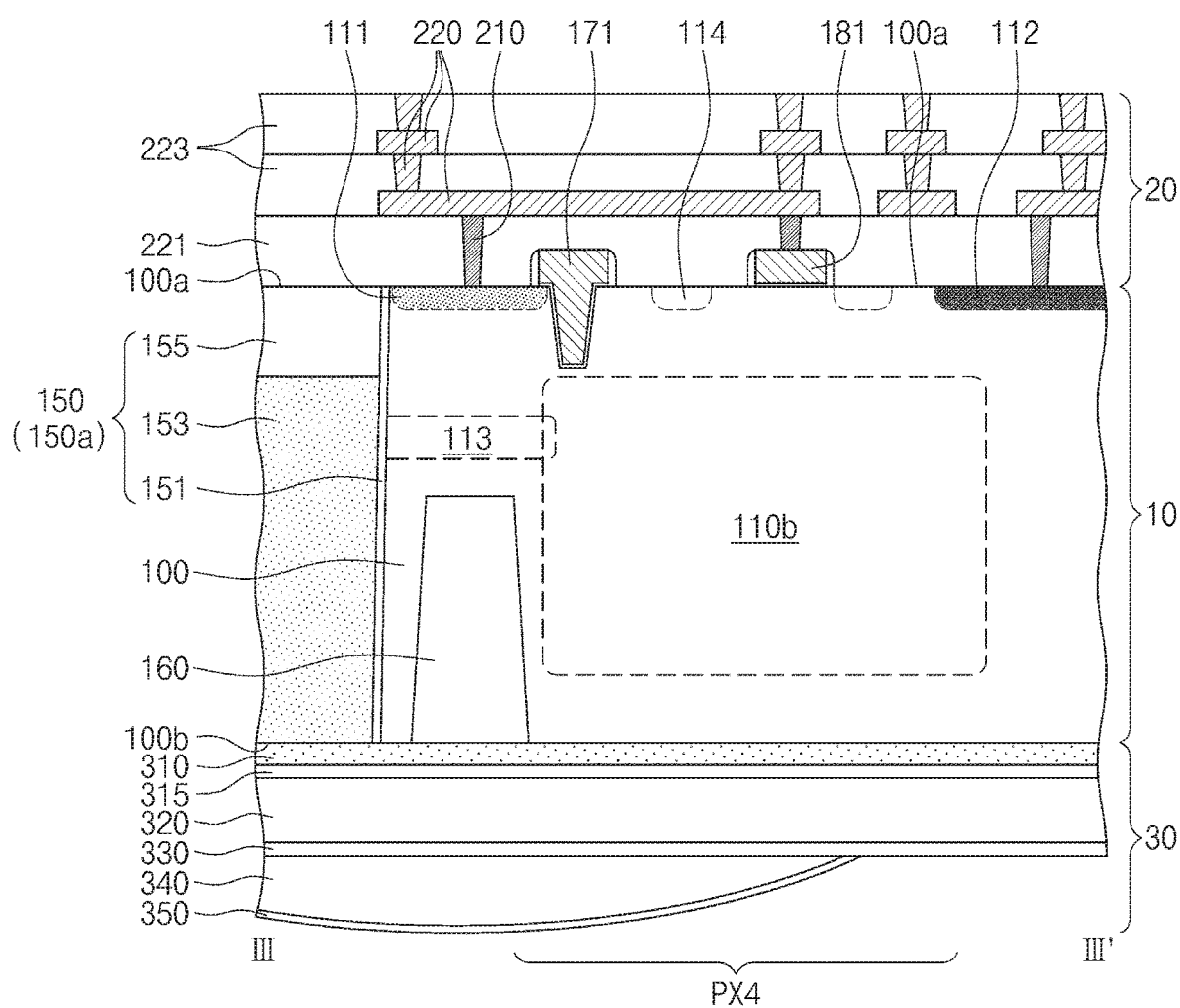
FIG. 11 illustrates a cross-sectional view taken along line V-V' of FIG. 8.

FIG. 8 illustrates a plan view that corresponds to section A of FIG. 2, that shows an image sensor according to some embodiments of the present inventive concepts. FIG. 9 illustrates a plan view that shows an image sensor according to some embodiments of the present inventive concepts. FIG. 10 illustrates a cross-sectional view taken along line IV-IV' of FIG. 8. FIG. 11 illustrates a cross-sectional view taken along line V-V' of FIG. 8. The components in FIGS. 8-10 may be the same or similar to corresponding earlier described components, and to the extent that a description of an element has been omitted, it may be understood that the element is at least similar to corresponding elements that are described elsewhere in the specification.

Referring to FIGS. 8 to 10, the image sensor according to some embodiments may further include subsidiary pixel separation structures 160.

The subsidiary pixel separation structures 160 may be provided in the first substrate 100. The subsidiary pixel separation structures 160 may extend from the second surface 100b toward the first surface 100a of the first substrate 100. The subsidiary pixel separation structures 160 may have widths that decrease from the second surface 100b to the first surface 100a of the first substrate 100. Each of the subsidiary pixel separation structures 160 may have a height H2 that is less than a height H1 of the pixel separation structure 150. For example, each of the subsidiary pixel separation structures 160 may have a top surface located at a level between the first and second surfaces 100a and 100b of the first substrate 100. Each of the subsidiary pixel separation structures 160 may have a bottom surface coplanar with the second surface 100b of the first substrate 100.

The subsidiary pixel separation structures 160 may vertically overlap with corresponding first impurity sections 111. A top surface of each of the subsidiary pixel separation structures 160 may have a cross shape, such as "+", when viewed in plan. The subsidiary pixel separation structures 160 may be spaced apart from the pixel separation structure 150. The subsidiary pixel separation structures 160 may include a dielectric material. For example, the subsidiary pixel separation structures 160 may include a silicon-based dielectric material, such as one or more of silicon oxide, silicon nitride, and silicon oxynitride.

The following will discuss components in the optical black area OB of the first substrate 100.

In the optical black area OB, the first substrate 100 may include a first reference pixel region RPX1 and a second reference pixel region RPX2 that are defined by the pixel separation structure 150 (see FIG. 3). The first reference pixel region RPX1 may be disposed between the second pixel reference pixel region RPX2 and the pixel array area AR. The first reference pixel region RPX1 may be provided with first, second, third, and fourth photoelectric conversion sections 110a, 110b, 110c, and 110d. The first, second, third, and fourth photoelectric conversion sections 110a, 110b, 110c, and 110d in the first reference pixel region RPX1 may have the same planar area and the same volume as the planar area and the volume of the first, second, third, and fourth photoelectric conversion sections 110a, 110b, 110c, and 110d in each of the first, second, third, and fourth pixel regions PX1, PX2, PX3, and PX4 as described above. The first, second, third, and fourth photoelectric conversion sections 110a, 110b, 110c, and 110d may not be provided on the second reference pixel region RPX2. The first and second reference pixel regions RPX1 and RPX2 may each include impurity sections and gate electrodes 171 and 181. The impurity sections and the gate electrodes 171 and 181 may be the same as those discussed in the pixel array area AR.

In the optical black area OB, an antireflection layer 315 may be provided on the second surface 100b of the first substrate 100. The antireflection layer 315 may horizontally extend from the pixel array area AR toward the optical black area OB, and cover the first substrate 100 and the pixel separation structure 150.

The optical black area OB may include a first through structure 70 provided on the first substrate 100. The first through structure 70 may include a first conductive pattern 71, a first through dielectric layer 73, a first buried pattern 75, and a first capping pattern 77.

A first through hole may be formed on the second surface 100b of the first substrate 100, and the first conductive pattern 71 may be provided in the first through hole. The first through hole may be disposed on a first side of a contact pad 91. The first through hole may be disposed between the contact pad 91 and the pixel separation structure 150. The first through hole may penetrate the first substrate 100, the first wiring layer 20, and at least a portion of a second wiring layer 50. The first through hole may have a first bottom surface and a second bottom surface. For example, the first bottom surface may be disposed higher, e.g., closer to the second surface 100b, than the second bottom surface. The first bottom surface of the first through hole may expose the line pattern of the conductive structures 210 and 220. The second bottom surface of the first through hole may expose a lower line 55 in the second wiring layer 50.

The first conductive pattern 71 may partially cover a top surface of the antireflection layer 315 on the second surface 100b of the first substrate 100, and may conformally cover an inner wall and the first and second bottom surfaces of the first through hole. The first conductive pattern 71 may penetrate the first substrate 100, the first wiring layer 20, and at least a portion of the second wiring layer 50. For example, the first conductive pattern 71 may be in contact with and electrically connected to the line pattern of the conductive structures 210 and 220 in the first wiring layer 20. The first conductive pattern 71 may also be in contact with and electrically connected to the lower line 55 in the second wiring layer 50. The first conductive pattern 71 may include a metallic material, such as copper, tungsten, aluminum, or any alloy thereof.

The first conductive pattern 71 may extend onto the second surface 100b of the first substrate 100 in the optical black area OB, and may serve as a light-shield layer. For example, the first conductive pattern 71 may substantially block visible light, and may extend onto the antireflection layer 315. The first conductive pattern 71 may horizontally contact lateral surfaces of the color filters 320 on the pixel array area AR. The first conductive pattern 71 may not allow light to enter the photoelectric conversion section 110 in the optical black area OB. In the optical black area OB, the first and second reference pixel regions RPX1 and RPX2 may have pixels that output noise signals without outputting photoelectric signals. For example, the signals output from the first and second reference pixel regions RPX1 and RPX2 may not be generated from incident light. The noise signals may be generated from electrons produced by heat or dark current. The first conductive pattern 71 may not cover the pixel array area AR, and thus light may be incident onto the first, second, third, and fourth photoelectric conversion sections 110a, 110b, 110c, and 110d on the pixel array area AR. The noise signals as generated from the first and second reference pixel regions RPX1 and RPX2 may be removed from photoelectric conversion signals that are output from the first, second, third, and fourth pixel regions PX1, PX2, PX3, and PX4.

The first through dielectric layer 73 may be provided on the first conductive pattern 71. The first through dielectric layer 73 may vertically and/or horizontally extend to cover the inner wall of the first through hole. The first through dielectric layer 73 may extend onto the second surface 100b of the first substrate 100 to cover a bias applying pad 92, and may partially cover a second conductive pattern 81 which will be discussed below. The first through dielectric layer 73 may contact the lateral surfaces of the color filters 320. The first through dielectric layer 73 may include a dielectric material, such as silicon oxide, aluminum oxide, hafnium oxide, silicon nitride, or silicon oxynitride.

The first buried pattern 75 may be provided on the first through dielectric layer 73 and fill a remaining portion of the first through hole. The first buried pattern 75 might not extend onto the second surface 100b of the first substrate 100. The first buried pattern 75 may include a material whose refractive index is low and has dielectric characteristics. The first buried pattern 75 may have a recession on a top surface thereof. For example, the top surface of the first buried pattern 75 may have a central portion located at a lower level, e.g., a level further from the surface on which light is incident, than that of an edge portion of the top surface of the first buried pattern 75.

The first capping pattern 77 may be disposed on the top surface of the first buried pattern 75 and fill the recession. The first capping pattern 77 may have a top surface that is substantially flat. The first capping pattern 77 may include a dielectric polymer, such as a photoresist material.

A bulk color filter 93 may cover the first through dielectric layer 73 and the first capping pattern 77. The bulk color filter 93 may be, for example, a blue color filter. The bulk color filter 93 may vertically overlap the first conductive pattern 71.

The following will describe components on the pad area PAD of the first substrate 100.

A contact pad trench may be formed on the second surface 100b on the pad area PAD of the first substrate 100, and the contact pad 91 may be provided in the pad contact trench. The contact pad 91 may include a metallic material, such as aluminum. During operation of the image sensor, the contact pad 91 may serve as an electrical connection path between the image sensor and the outside (for example, between the image sensor and other components in an electronic device). For example, the contact pad 91 may externally output electrical signals generated from the first, second, third, and fourth pixel regions PX1, PX2, PX3, and PX4.

A second through structure 80 may be provided on the pad area PAD of the first substrate 100. The second through structure 80 may include a second conductive pattern 81, a second through dielectric layer 83, a second buried pattern 85, and a second capping pattern 87.

A second through hole may be formed on the second surface 100b of the first substrate 100, and the second conductive pattern 81 may be provided in the second through hole. The second through hole may be disposed on a second side of the contact pad 91. The second side of the contact pad 91 may a different side than the first side of the contact pad 91. For example, the second side of the contact pad 91 may be a side that is closer to the peripheral edge of the image sensor than the first side of the contact pad 91. The second through hole may penetrate the first substrate 100, the first wiring layer 20, and at least a portion of the second wiring layer 50. The second through hole may have a bottom surface that exposes the lower line 55 in the second wiring layer 50.

On the pad area PAD, the second conductive pattern 81 may be provided on the first surface 100a of the first substrate 100. The second conductive pattern 81 may conformally cover an inner sidewall and a bottom surface of a contact pad trench. The second conductive pattern 81 may further extend into the second through hole to conformally cover an inner wall and the bottom surface of the second through hole. The second conductive pattern 81 may be electrically connected to the contact pad 91. The second conductive pattern 81 may penetrate the first substrate 100, the first wiring layer 20, and at least a portion of the second wiring layer 50. For example, the second conductive pattern 81 may be in contact with and electrically connected to the lower line 55 in the second wiring layer 50. The second conductive pattern 81 may include a metallic material, such as copper, tungsten, or aluminum.

The second through dielectric layer 83 may be disposed on the second conductive pattern 81. The second through dielectric layer 83 may vertically and horizontally extend to cover the inner wall of the second through hole. The second through dielectric layer 83 may extend onto the second surface 100b of the first substrate 100. However, the second through dielectric layer 83 might not cover a top surface of the contact pad 91. The second through dielectric layer 83 may include a dielectric material, such as silicon oxide, aluminum oxide, hafnium oxide, silicon nitride, or silicon oxynitride.

The second buried pattern 85 may be provided on the second through dielectric layer 83 to fill a remaining portion of the second through hole. The second buried pattern 85 might not extend onto the second surface 100b of the first substrate 100. The second buried pattern 85 may include the same material as that of the first buried pattern 75. The second buried pattern 85 may have a recession on a top surface thereof. For example, the top surface of the second buried pattern 85 may have a central portion located at a lower level, e.g. at a level further from the surface of the image sensor on which light is incident, than that of an edge portion of the top surface of the second buried pattern 85.

The second capping pattern 87 may be disposed on the top surface of the second buried pattern 85, thereby filling the recession. The second capping pattern 87 may have a top surface that is substantially flat. The second capping pattern 87 may include a dielectric polymer, such as a photoresist material.

In the optical black area OB and the pad area PAD, an organic layer 95 may be provided on the first surface 100a of the first substrate 100. In the optical black area OB, the organic layer 95 may cover a top surface of the first through dielectric layer 73 and a top surface of the bulk color filter 93. On the pad area PAD, the organic layer 95 may cover the second through dielectric layer 83 and the second capping pattern 87, but might not cover the top surface of the contact pad 91. Therefore, the top surface of the contact pad 91 may be externally exposed. The organic layer 95 may be transparent to visible light. The organic layer 95 may have a top surface that is substantially flat. The organic layer 95 may include, for example, a polymer. The organic layer 95 may have dielectric characteristics. In some embodiments, the organic layer 95 may be connected to the micro-lenses 340. The organic layer 95 may include the same material as that of the micro-lenses 340.

A coating layer 97 may be provided on the organic layer 95. The coating layer 97 may conformally cover the top surface of the organic layer 95. The coating layer 97 may include a dielectric material, and may be transparent to visible light. The coating layer 97 may include the same material as that of the lens coating layer 350.

Referring back to FIG. 3, the image sensor may include the circuit chip 2000. The circuit chip 2000 may be stacked on the sensor chip 1000. The circuit chip 2000 may include a second wiring layer 50 and a second substrate 40. The second wiring layer 50 may be interposed between the first wiring layer 20 and the second substrate 40. Integrated circuits TR may be disposed on a top surface of the second substrate 40 or in the second substrate 40. The integrated circuits TR may include logic circuits, memory circuits, or any combination thereof. The integrated circuits TR may include, for example, transistors. The second wiring layer 50 may include lower dielectric layers and lower lines 55. The lower lines 55 may be provided between or in the lower dielectric layers. The lower lines 55 may be electrically connected to the integrated circuits TR, and may be coupled to the first and second through structures 70 and 80.

FIGS. 12 to 16 illustrate cross-sectional views taken along line II-II' of FIG. 4, and show a method of fabricating an image sensor according to some embodiments of the present inventive concepts.

Figure 12:
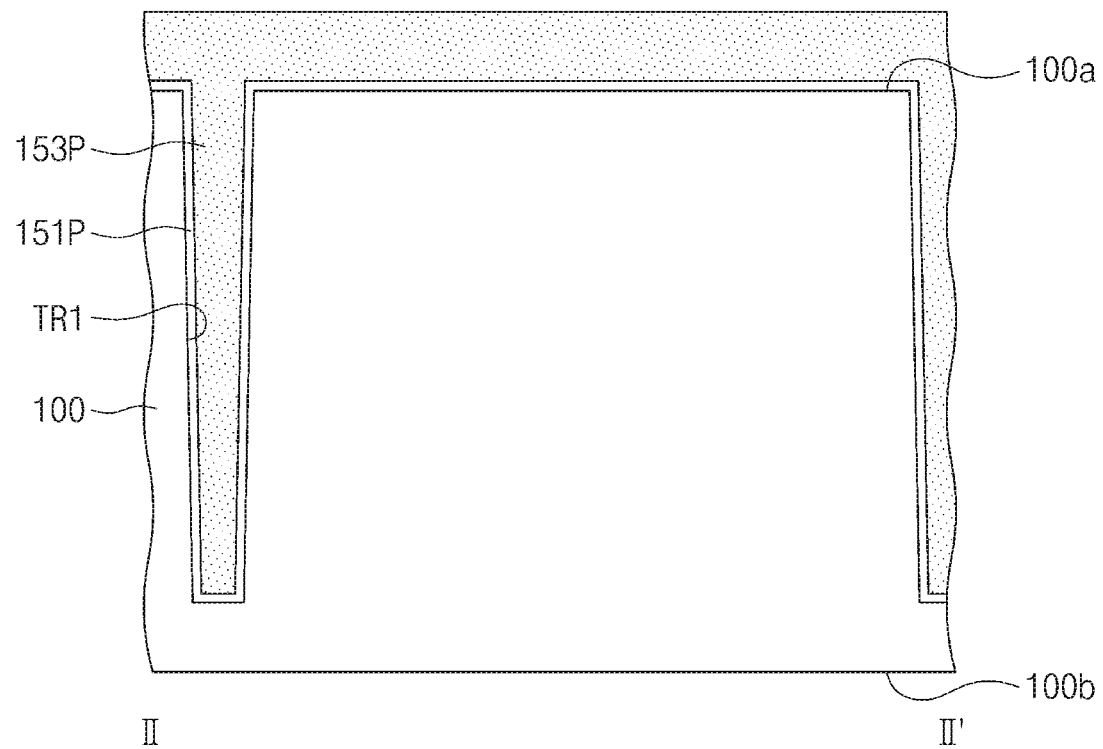
FIGS. 12 to 16 illustrate cross-sectional views taken along line II-II' of FIG. 4, that each show a method of fabricating an image sensor according to some embodiments of the present inventive concepts.

Referring to FIG. 12, a first substrate 100 may be prepared which has a first surface 100a and a second surface 100b that are opposite to each other. The first substrate 100 may include impurities of a first conductivity type (e.g., p-type). For example, the first substrate 100 may be a substrate in which an epitaxial layer of the first conductivity type is formed on a bulk silicon substrate of the first conductivity type. In another example embodiment, the first substrate 100 may be a bulk substrate which includes a well of the first conductivity type.

A first trench TR1 may be formed on a first surface 100a of the first substrate 100. The formation of the first trench TR1 may include forming a first mask pattern on the first surface 100a of the first substrate 100, and using the first mask pattern to perform an etching process on the first surface 100a.

After the formation of the first trench TR1, a preliminary dielectric pattern 151p may be formed to conformally cover an inner wall of the first trench TR1 and the first surface 100a of the first substrate 100. The preliminary dielectric pattern 151p may be formed by coating a dielectric material on the first substrate 100 in which the first trench TR1 is formed. The preliminary dielectric pattern 151p may include, for example, silicon oxide, silicon nitride, and/or silicon oxynitride.

A preliminary semiconductor pattern 153p may be formed on the preliminary dielectric pattern 151p. The preliminary semiconductor pattern 153p may be formed by performing a deposition process on the first substrate 100 on which the preliminary dielectric pattern 151p is formed. The preliminary semiconductor pattern 153p may fill the first trench TR1 and cover the preliminary dielectric pattern 151p on the inner wall of the first trench TR1. The preliminary semiconductor pattern 153p may include, for example, polysilicon.

Figure 13:
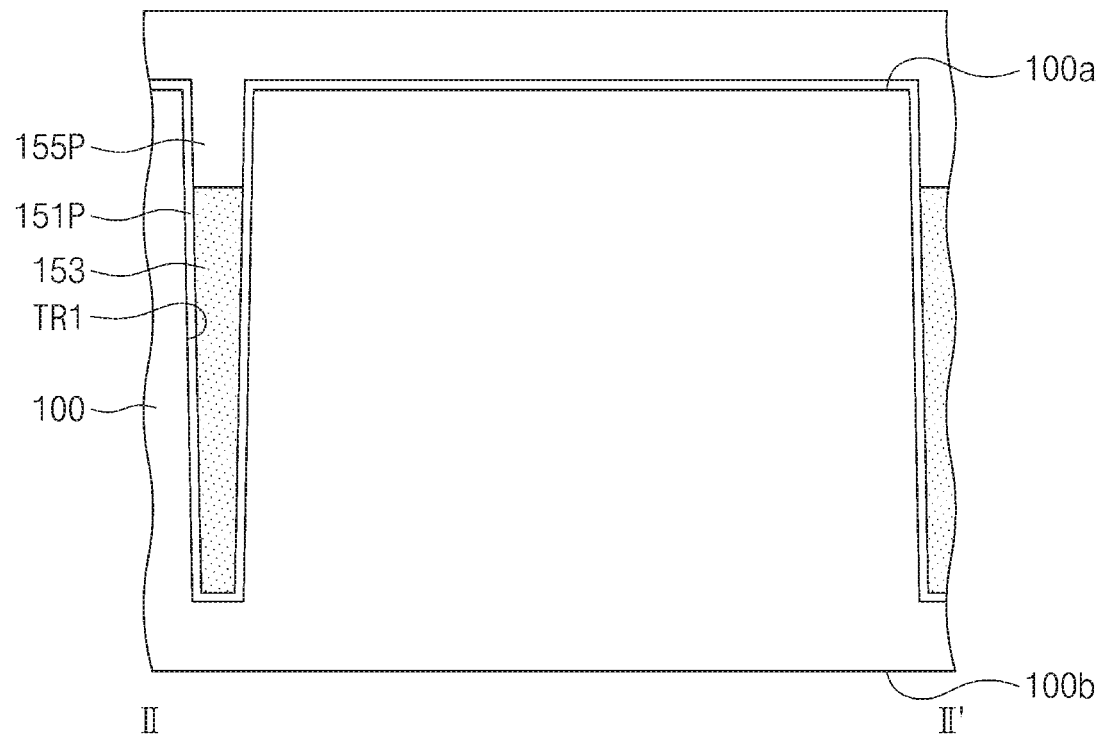

Referring to FIG. 13, an etching process may be performed on the preliminary semiconductor pattern 153p. In the etching process, an upper portion of the preliminary semiconductor pattern 153p may be removed to form a semiconductor pattern 153. Accordingly, a portion of the preliminary dielectric pattern 151p may be exposed.

A preliminary capping layer 155p may be formed on the preliminary dielectric pattern 151p and the semiconductor pattern 153. The formation of the preliminary capping layer 155p may include performing a deposition process on the first surface 100a of the first substrate 100. The preliminary capping layer 155p may include silicon oxide, silicon nitride, and/or silicon oxynitride.

Figure 14:
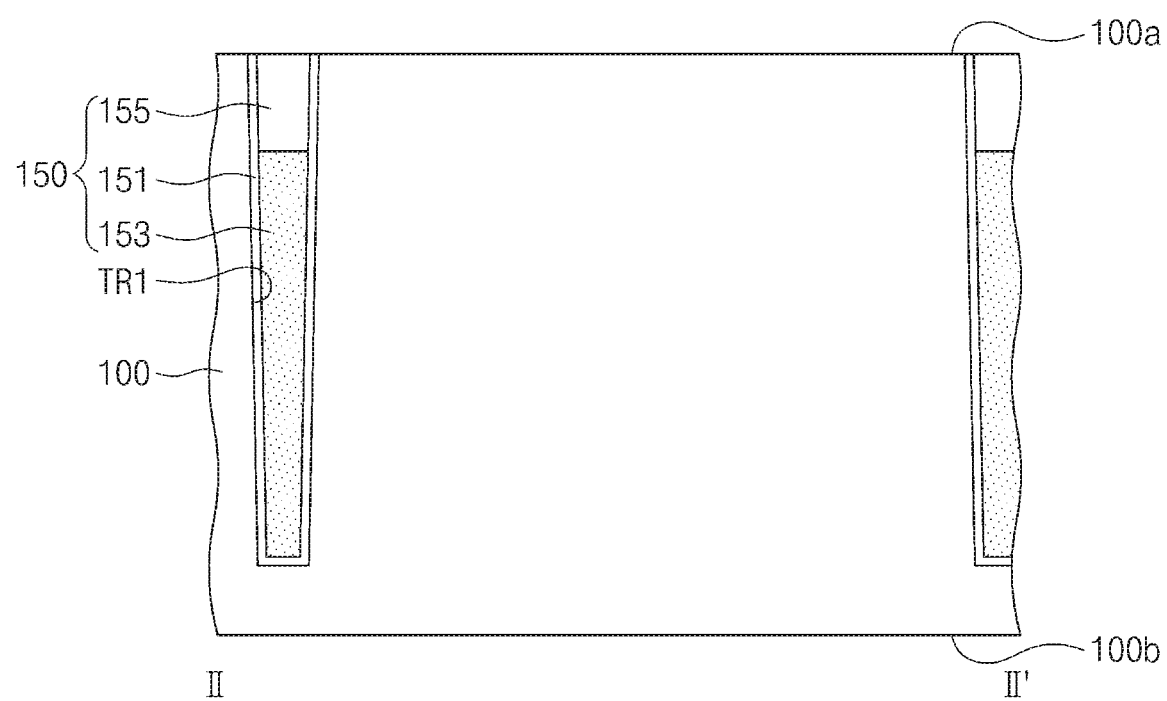

Referring to FIG. 14, a dielectric pattern 151 and a capping pattern 155 may be formed. The formation of the dielectric pattern 151 and the capping pattern 155 may include performing a planarization process on the first surface 100a of the first substrate 100. The planarization process may remove an upper portion of the preliminary dielectric pattern 151p and an upper portion of the preliminary capping layer 155p. Accordingly, the first surface of the first substrate 100 may be coplanar with a top surface of the capping pattern 155 and a top surface of the dielectric pattern 151.

Figure 15:
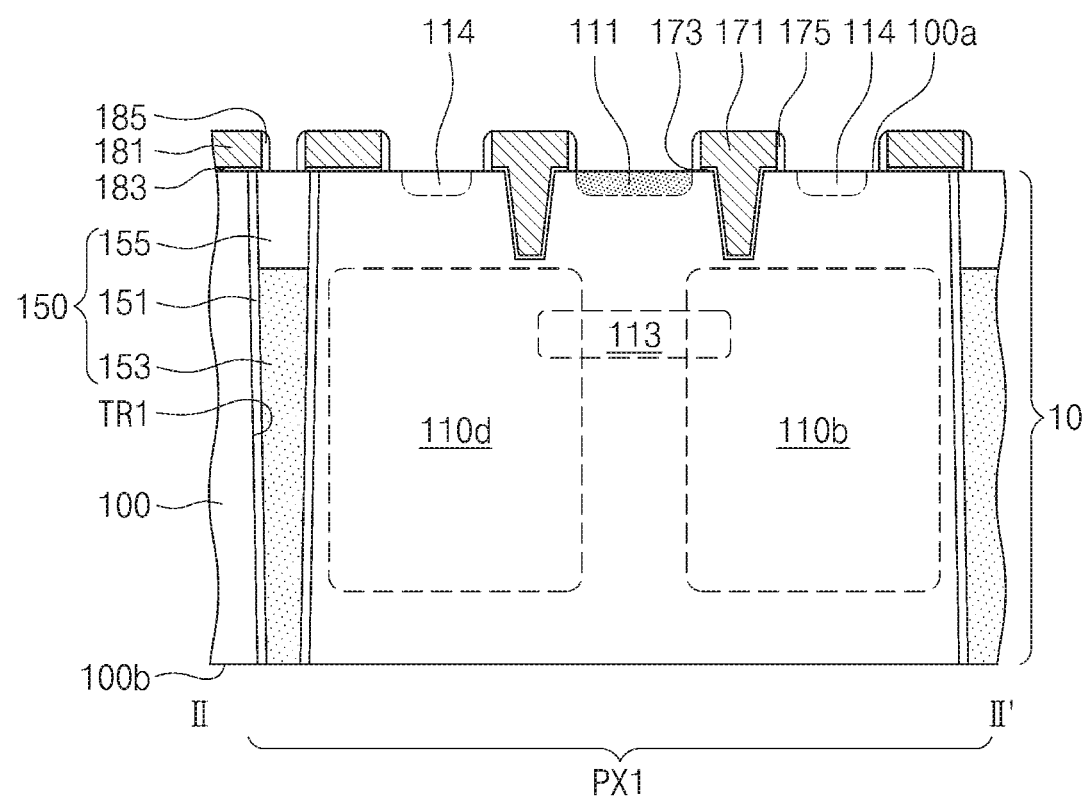

Referring to FIG. 15, each of first, second, third, and fourth pixel regions PX1, PX2, PX3, and PX4 may be doped with impurities to form first, second, third, and fourth photoelectric conversion sections 110a, 110b, 110c, and 110d. Each of the first, second, third, and fourth photoelectric conversion sections 110a, 110b, 110c, and 110d may have a second conductivity type (e.g., n-type) that is different from the first conductivity type (e.g., p-type). According to some embodiments, the first, second, third, and fourth pixel regions PX1, PX2, PX3, and PX4 may be doped with impurities to form third impurity sections 113. The third impurity sections 113 may have the second conductivity type (e.g., n-type).

A thinning process may be performed in which a portion of the first substrate 100 is removed to reduce a vertical thickness of the first substrate 100. The thinning process may include grinding or polishing the second surface 100b of the first substrate 100 and/or anisotropically or isotropically etching the second surface 100b of the first substrate 100. During fabrication, the first substrate 100 may be turned upside down to thin the first substrate 100. A grinding or polishing process may be performed to remove a portion of the first substrate 100, and then an anisotropic or isotropic etching process may be performed to remove surface defects that remain on the first substrate 100.

The thinning process on the second surface 100b of the first substrate 100 may expose a bottom surface of the dielectric pattern 151 and a bottom surface of the semiconductor pattern 153. The bottom surfaces of the dielectric pattern 151 and the semiconductor pattern 153 may be coplanar with the second surface 100b of the first substrate 100. Transistors may be formed on the first surface 100a of the first substrate 100. The formation of the transistors may include forming gate electrodes 171 and 181, and doping the first surface 100a of the first substrate 100 with impurities to form first impurity sections 111, second impurity sections (see 112 of FIG. 4 or 5), and fourth impurity sections 114. The first, second, and fourth impurity sections 111, 112, and 114 may vary in composition across embodiments, and may include n-type or p-type impurities.

Figure 16:
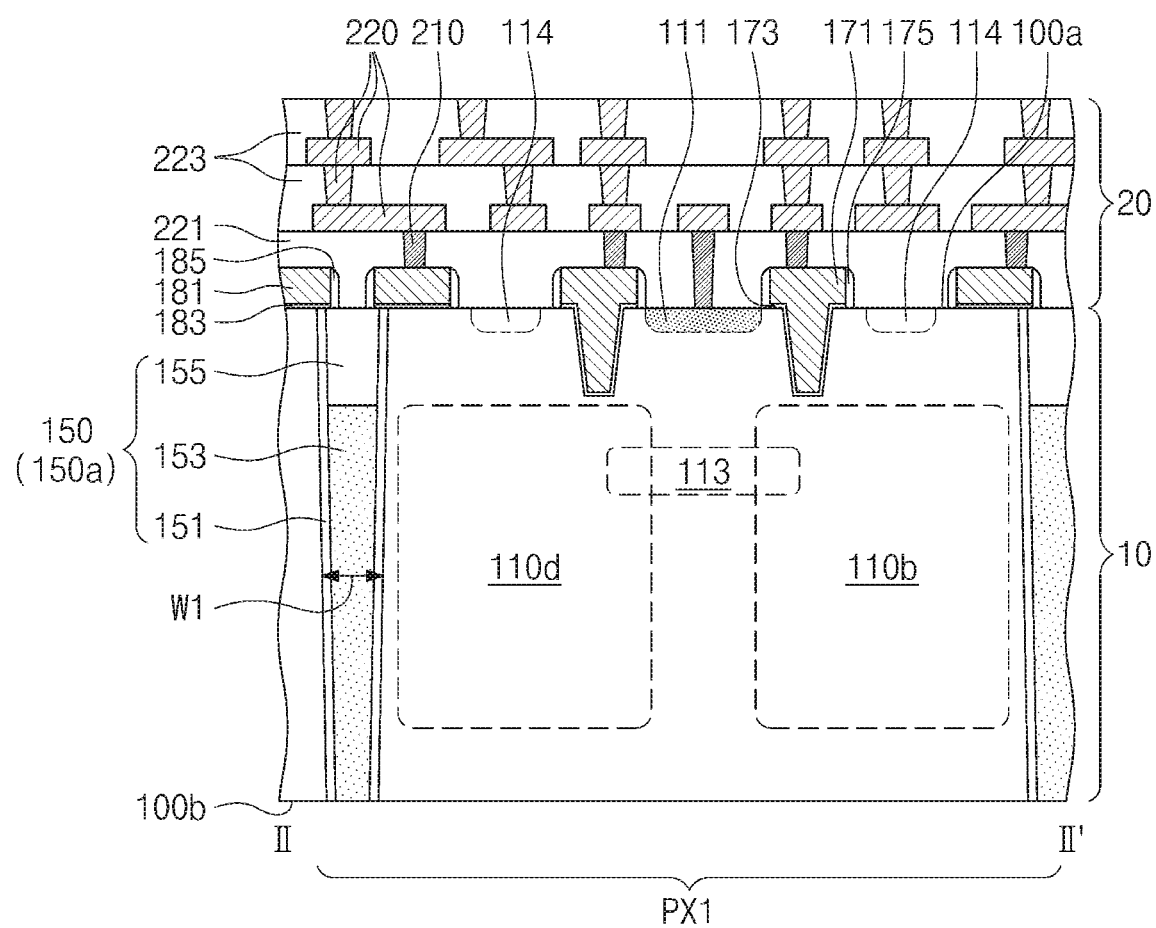

Referring to FIG. 16, a first wiring layer 20 may be formed on the first surface 100a of the first substrate 100. The formation of the first wiring layer 20 may include forming a first dielectric layer 221 that covers the gate electrodes 171 and 181 formed on the first surface 100a of the first substrate 100, forming a contact plug part 210 of a conductive structures 210 and 220 that penetrates the first dielectric layer 221, forming a second dielectric layer 223 that covers the contact plug part 210 and the first dielectric layer 221, and forming a line pattern and a via pattern of the conductive structures 210 and 220 disposed in the second dielectric layer 223. The first and second dielectric layers 221 and 223 may be formed by depositing a dielectric material on the first surface 100a of the first substrate 100. The conductive structures 210 and 220 may be formed by etching the first dielectric layer 221 or the second dielectric layer 223 and depositing a conductive material.

Referring back to FIG. 6, a first backside dielectric layer 310, an antireflection layer 315, color filters 320, a second backside dielectric layer 330, and micro-lenses 340 may be formed on the second surface 100b of the first substrate 100.

An organic layer may be deposited on the micro-lenses 340, thereby forming a lens coating layer 350. Accordingly, an image sensor according to embodiments of the present inventive concepts may be formed.

According to some embodiments of the present inventive concepts, a pixel region group including first through fourth pixel regions may include a ground section on a central portion thereof. The ground section may be shared by the first through fourth pixel regions. Each of the first through fourth pixel regions may include a floating diffusion section on a central portion thereof. An image sensor which adheres to the arrangement of the ground section and the floating diffusion section as described herein in accordance with some embodiments of the present inventive concepts may have a maximized spatial efficiency, and thereby have increased operating characteristics.

Objects of the present inventive concepts are not limited to the mentioned above, and other objects which have not been mentioned above will be clearly understood to those skilled in the art from the description and the accompanying claims.

Although the present inventive concepts have been described in connection with some embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitutions, modifications, and changes may be made to the embodiments described herein without departing from the scope and spirit of the present inventive concepts.

What is claimed is:

1. An image sensor, comprising:
  a semiconductor substrate that includes first, second, third, and fourth pixel regions, wherein each of the first through fourth pixel regions include first, second, third, and fourth photoelectric conversion sections; and
  a pixel separation structure disposed in the semiconductor substrate, wherein the pixel separation structure separates the first through fourth pixel regions from each other,
  wherein the second pixel region is spaced apart from the first pixel region in a first direction,
  wherein the fourth pixel region is spaced apart from the first pixel region in a second direction, wherein the second direction intersects the first direction,
  wherein the semiconductor substrate includes:
    a plurality of first impurity sections, wherein each first impurity section of the plurality of first impurity sections is disposed on a corresponding central portion of each pixel region of the first through fourth pixel regions; and
    a second impurity section disposed between the second pixel region and the fourth pixel region,
  wherein the first impurity sections have a conductivity type that is different from a conductivity type of the second impurity section, and
  wherein the second impurity section overlaps a space that is between ends of the pixel separation structure.

2. The image sensor of claim 1, wherein the pixel separation structure includes:
  a plurality of first pixel separation parts that are spaced apart from each other in the first direction, wherein each of the plurality of first pixel separation parts extends in the first direction;
  a plurality of second pixel separation parts, wherein the second pixel separation parts of the plurality of second pixel separation parts extend in the second direction and are spaced apart from each other, and wherein the second pixel separation parts intersect the first pixel separation parts,
  wherein the second impurity section is disposed between two adjacent first pixel separation parts.

3. The image sensor of claim 2, wherein a top surface of the second impurity section has an X shape.

4. The image sensor of claim 2, wherein the pixel separation structure further includes a plurality of protruding parts, wherein each protruding part in the plurality of protruding parts extends from a central portion of each of the first and second pixel separation parts toward the central portion of each of the first through fourth pixel regions,
  wherein the first impurity section is disposed between facing protruding parts of the plurality of protruding parts.

5. The image sensor of claim 4, wherein the first through fourth photoelectric conversion sections of each of the first through fourth pixel regions are surrounded by the first pixel separation parts, the second pixel separation parts, and the protruding parts,
  and wherein each of the first impurity sections vertically overlaps a portion of each of the first through fourth photoelectric conversion sections.

6. The image sensor of claim 4, wherein a top surface of each of the first impurity sections has an X shape.

7. The image sensor of claim 2, wherein the semiconductor substrate further includes a plurality of third impurity sections disposed in the semiconductor substrate,
  wherein each of the third impurity sections vertically overlaps each of the first impurity sections, and
  wherein each of the third impurity sections electrically connects the first through fourth photoelectric conversion sections to each other.

8. The image sensor of claim 1, further comprising first, second, third, and fourth micro-lenses, wherein the first through fourth micro-lenses are respectively disposed on the first through fourth pixel regions,
  wherein each of the first through fourth micro-lenses vertically overlaps the first through fourth photoelectric conversion sections of a corresponding pixel region of the first through fourth pixel regions.

9. The image sensor of claim 8, wherein the semiconductor substrate has a first surface, and a second surface that is opposite to the first surface, wherein the first surface is adjacent to the first through fourth micro-lenses,
  and wherein a width of the pixel separation structure decreases as it extends from the second surface to the first surface.

10. An image sensor, comprising:
  a semiconductor substrate that includes first, second, third, and fourth pixel regions, wherein each of the first through fourth pixel regions includes first, second, third, and fourth photoelectric conversion sections;
  a pixel separation structure disposed in the semiconductor substrate and separating the first through fourth pixel regions from each other; and
  a plurality of subsidiary pixel separation structures disposed in the semiconductor substrate, wherein each subsidiary pixel separation structure of the plurality of subsidiary pixel separation structures is disposed on a corresponding central portion of each pixel region of the first through fourth pixel regions, wherein the second pixel region is spaced apart from the first pixel region in a first direction, wherein the fourth pixel region is spaced apart from the first pixel region in a second direction, wherein the second direction intersects the first direction, wherein the semiconductor substrate includes:
- a plurality of first impurity sections, wherein each of the plurality of impurity sections is disposed on a corresponding central portion of each pixel region of the first through fourth pixel regions; and
- a second impurity section disposed between the second pixel region and the fourth pixel region, wherein the plurality of subsidiary pixel separation structures is spaced apart from the pixel separation structure, and wherein each subsidiary pixel separation structure of the plurality of subsidiary pixel separation structures vertically overlaps each of the first impurity sections.

11. The image sensor of claim 10, wherein the second impurity section includes a ground section,
wherein the first impurity section has a conductivity type different from a conductivity type of the second impurity section.

12. The image sensor of claim 10, wherein the pixel separation structure includes:
- a plurality of first pixel separation parts that extend in the first direction and are spaced apart from each other;
- a plurality of second pixel separation parts that extend in the second direction and are spaced apart from each other, the second pixel separation parts intersecting the first pixel separation parts, wherein an end of one first pixel separation part of the plurality of first pixel separation parts is spaced apart in the first direction from an end of an adjacent first pixel separation part of the plurality of first pixel separation parts, and wherein the second impurity section is disposed between the ends of the adjacent and spaced apart first pixel separation parts.

13. The image sensor of claim 12, wherein the pixel separation structure further includes a plurality of protruding parts, wherein each protruding part in the plurality of protruding parts extends from a central portion of each of the first and second pixel separation parts toward the central portion of each of the first through fourth pixel regions,
wherein the first impurity section is disposed between adjacent protruding parts.

14. The image sensor of claim 13, wherein a top surface of each of the subsidiary pixel separation structure has a cross shape or a "+" shape.

15. The image sensor of claim 13, wherein each of the subsidiary pixel separation structures is disposed between protruding parts that are adjacent to each other, and
wherein each of the subsidiary pixel separation structures is disposed between the first through fourth photoelectric conversion sections.

16. The image sensor of claim 10, further comprising first, second, third, and fourth micro-lenses that are respectively disposed on the first through fourth pixel regions,
wherein the semiconductor substrate has a first surface, and a second surface that is opposite to the first surface, wherein the first surface is adjacent to the first through fourth micro-lenses, and
wherein each of the subsidiary pixel separation structures extends from the first surface toward the second surface.

17. The image sensor of claim 10, wherein a height of each of the subsidiary pixel separation structures is less than a height of the pixel separation structure.

18. The image sensor of claim 10, wherein the semiconductor substrate further includes a plurality of third impurity sections disposed in the semiconductor substrate,
wherein each of the third impurity sections vertically overlaps each of the subsidiary pixel separation structures, and
wherein each of the third impurity sections electrically connects the first through fourth photoelectric conversion sections to each other.

19. An image sensor, comprising:
- a semiconductor substrate that includes first, second, third, and fourth pixel regions, wherein each of the first through fourth pixel regions include first, second, third, and fourth photoelectric conversion sections, and wherein the semiconductor substrate has a first surface and a second surface opposite to the first surface;
- a pixel separation structure disposed in the semiconductor substrate and separating the first through fourth pixel regions from each other;
- a plurality of gate electrodes disposed on the first surface,
- a plurality of wiring lines disposed on the first surface; and
- first, second, third, and fourth micro-lenses disposed on the second surface and respectively disposed in the first through fourth pixel regions, wherein the second pixel region is spaced apart from the first pixel region in a first direction, wherein the fourth pixel region is spaced apart from the first pixel region in a second direction, the second direction intersecting the first direction, wherein the semiconductor substrate includes:
- a plurality of first impurity sections on corresponding central portions of the first through fourth pixel regions;
- a second impurity section between the second pixel region and the fourth pixel region; and
- a plurality of third impurity sections that electrically connect the first through fourth photoelectric conversion sections to each other, wherein the pixel separation structure includes:
- a plurality of first pixel separation parts that extend in the first direction and are spaced apart from each other;
- a plurality of second pixel separation parts that extend in the second direction and are spaced apart from each other, the second pixel separation parts intersecting the first pixel separation parts; and
- a plurality of protruding parts, wherein each protruding part in the plurality of protruding parts extends from a central portion of each of the first and second pixel separation parts toward the central portion of each of the first through fourth pixel regions, and wherein impurities doped in the first impurity section are different from impurities doped in the second impurity section.

20. The image sensor of claim 19, further comprising a plurality of subsidiary pixel separation structures disposed in the semiconductor substrate, and wherein each subsidiary pixel separation structure of the plurality of subsidiary pixel separation structures is disposed on a corresponding central portion of a corresponding pixel region of the first through fourth pixel regions, wherein the plurality of subsidiary pixel separation structures is spaced apart from the pixel separation structure, and wherein each of the subsidiary pixel separation structures vertically overlaps each of the first impurity sections.

* * * * *